(12) United States Patent
Ochs et al.

(10) Patent No.: US 12,184,304 B2
(45) Date of Patent: Dec. 31, 2024

(54) SYSTEM, METHOD, AND COMPUTER PROGRAM PRODUCT FOR END-TO-END CRC OVERHEAD HIDING

(71) Applicant: Volkswagen Group of America Investments, LLC, Reston, VA (US)

(72) Inventors: Tilmann Wilhelm Wolfgang Ochs, Munich (DE); Stuart John Lowe, Gibsonia, PA (US); Dalton Miles Woodard, Menlo Park, CA (US)

(73) Assignee: Volkswagen Group of America Investments, LLC, Reston, VA (US)

( * ) Notice: Subject to any disclaimer, the term of this patent is extended or adjusted under 35 U.S.C. 154(b) by 0 days.

(21) Appl. No.: 18/066,012

(22) Filed: Dec. 14, 2022

(65) Prior Publication Data

US 2024/0204798 A1 Jun. 20, 2024

(51) Int. Cl.
*H03M 13/09* (2006.01)

(52) U.S. Cl.
CPC ........ *H03M 13/091* (2013.01); *H03M 13/096* (2013.01)

(58) Field of Classification Search
CPC .................................................. H03M 13/091
See application file for complete search history.

(56) References Cited

U.S. PATENT DOCUMENTS

| | | | |
|---|---|---|---|
| 7,904,787 B2 | 3/2011 | Clark et al. | |
| 8,001,446 B2 | 8/2011 | Walma | |
| 8,386,878 B2 * | 2/2013 | Pi | H04L 1/0041 |
| | | | 714/752 |
| 8,555,148 B2 * | 10/2013 | Pi | H04L 1/0083 |
| | | | 714/755 |
| 8,627,171 B2 * | 1/2014 | Pi | H03M 13/2906 |
| | | | 370/242 |
| 8,977,943 B2 | 3/2015 | Kwan | |
| 9,003,259 B2 | 4/2015 | Cooper | |
| 2004/0268206 A1 * | 12/2004 | Kim | H04L 1/06 |
| | | | 714/758 |
| 2009/0037653 A1 * | 2/2009 | Brokenshire | G06F 13/28 |
| | | | 711/E12.002 |
| 2009/0077447 A1 * | 3/2009 | Buckley | H03M 13/09 |
| | | | 714/757 |

\* cited by examiner

*Primary Examiner* — Joseph D Torres
(74) *Attorney, Agent, or Firm* — The Webb Law Firm

(57) ABSTRACT

Provided are systems, methods, and computer program products for protecting AV communications including a sender component and a receiver component from components of an AV system communicating via a shared memory buffer, the sender component configured to send one or more serialized communications to the receiver component, by controlling at least one processor to access a data block storing message data; obtain a first instruction for serializing a communication; obtain a second instruction for computing a CRC checksum; and interleave the CRC checksum with serialized message data to generate a communication within a communication channel, by computing a serialized communication of the message data in the data block based on the first instruction, while concurrently computing the CRC checksum for the message data based on the second instruction.

19 Claims, 7 Drawing Sheets

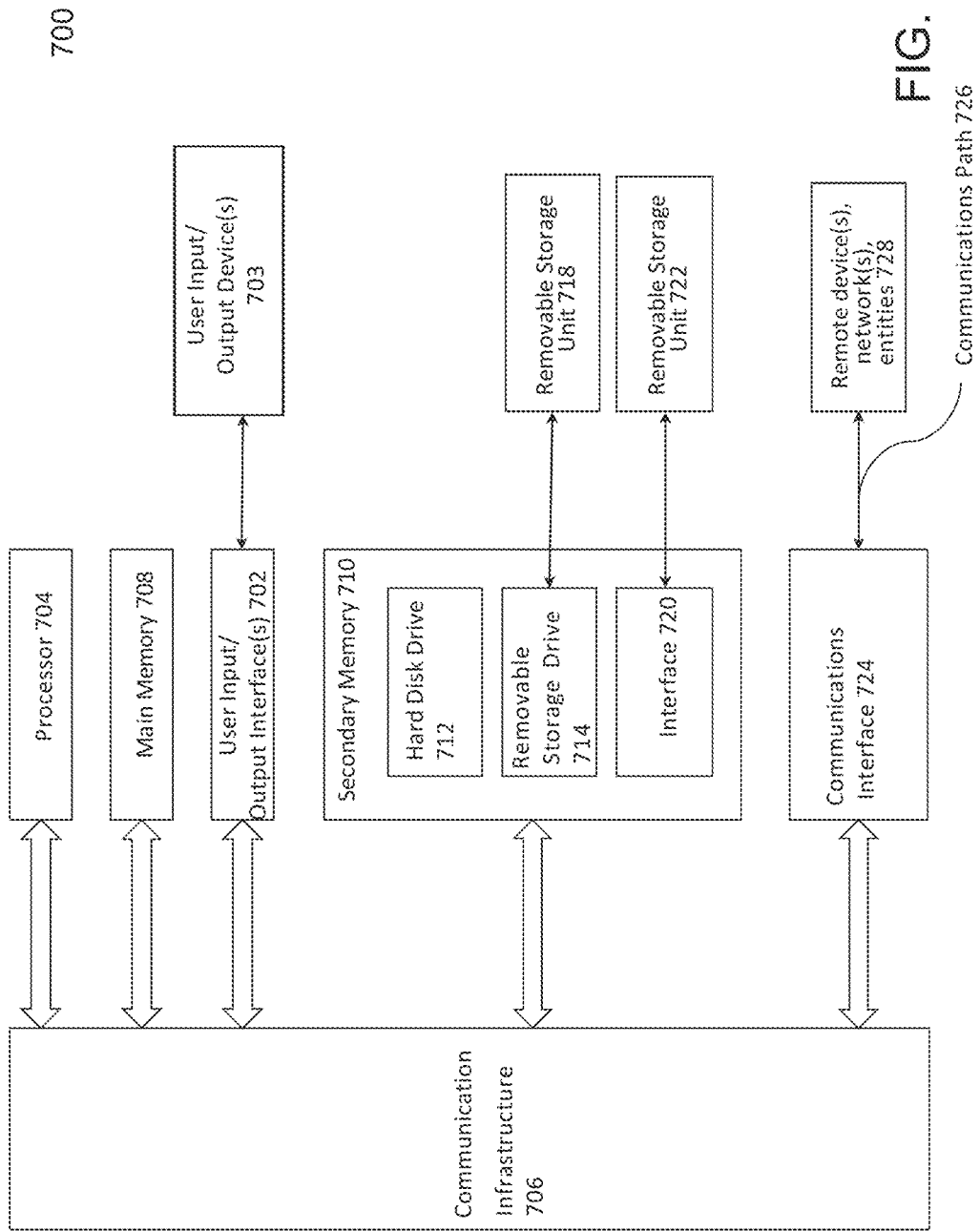

SYSTEM, METHOD, AND COMPUTER PROGRAM PRODUCT FOR END-TO-END CRC OVERHEAD HIDING

FIELD

This disclosure relates generally to a cyclic redundancy check (CRC) overhead hiding, such as by concealing the calculation time of the CRC checksum within the execution time of the serialization algorithm and verifying the checksum within the execution time of the deserialization algorithm.

BACKGROUND

An autonomous vehicle (AV) is required to find an optimal route from the AV's current location to a specified destination (e.g., a goal, a specific location, a position, etc.) in a geographic area of a road network. To travel autonomously, an AV requires autonomy software, sensors, and diagnostics to form and successfully traverse a route to a destination or a goal. A self-driving system (SDS), hardware, and software allows a vehicle to operate autonomously, without the need for a driver, within a specific geographic area. When an AV equipped with an SDS is in autonomous mode, the SDS will have full responsibility for the task of driving while meeting the standards for an automated driving system.

The SDS involves significant numbers of communications (e.g., messages, notifications, updates, etc.) sent between components or devices of autonomy software and/or the diagnostics system (e.g., communication channels, etc.). Communication channels are used to ensure that an SDS receives sufficient information about the state of the AV. Also, communication channels among components of the autonomy software and SDS architecture account for operational and functional mechanisms and for identifying common faults and cascading faults at the system level. Communication channels also help to implement critical hardware redundancy, eliminate or modify hardware paths with high failure rates, design diagnostic mechanisms to detect and respond to faults, or to reduce the probability of system failures. However, communications can become corrupted, and quite frequently, especially given a large number of communications that must be transmitted, may be less efficient and/or introduce inefficiencies to the communication network, or otherwise cause inefficiency or be unable to protect communications in an AV.

SUMMARY

Accordingly, disclosed are improved computer-implemented systems, methods, and computer program products for end-to-end hiding of cyclic redundancy check (CRC) overhead.

According to non-limiting embodiments or aspects, provided is a computer-implemented method for an end-to-end CRC overhead hiding method, comprising: accessing, by a microprocessor, a data block storing message data; obtaining, by the microprocessor, a first instruction for serializing a communication; obtaining, by the microprocessor, a second instruction for computing a CRC checksum; and interleaving, by the microprocessor, the CRC checksum with serialized message data to generate a communication within a communication channel, by computing a serialized communication of the message data in the data block based on the first instruction, while concurrently computing the CRC checksum for the message data based on the second instruction.

According to non-limiting embodiments or aspects, provided is a an end-to-end CRC overhead hiding system, comprising: a protected communication channel including at least one sender component and at least one receiver component from components of a system communicating via a shared memory buffer; and the at least one sender component configured to send one or more serialized communications to the receiver component, by controlling at least one processor to: access a data block storing message data; obtain a first instruction for serializing a communication; obtain a second instruction for computing a CRC checksum; and interleave the CRC checksum with serialized message data to generate a communication within a communication channel, by computing a serialized communication of the message data in the data block based on the first instruction, while concurrently computing the CRC checksum for the message data based on the second instruction.

According to non-limiting embodiments or aspects, provided is a non-transitory computer-readable medium having instructions stored thereon that, when executed by at least one computing device, cause the at least one computing device to: access a data block storing message data; obtain a first instruction for serializing a communication; obtain a second instruction for computing a CRC checksum; and interleave the CRC checksum with serialized message data to generate a communication within a communication channel, by computing a serialized communication of the message data in the data block based on the first instruction, while concurrently computing the CRC checksum for the message data based on the second instruction.

Further non-limiting embodiments or aspects are set forth in the following numbered clauses:

Clause 1: A computer-implemented method for an end-to-end cyclic redundancy check (CRC) overhead hiding method, comprising: accessing, by a microprocessor, a data block storing message data; obtaining, by the microprocessor, a first instruction for serializing a communication; obtaining, by the microprocessor, a second instruction for computing a CRC checksum; and interleaving, by the microprocessor, the CRC checksum with serialized message data to generate a communication within a communication channel, by computing a serialized communication of the message data in the data block based on the first instruction, while concurrently computing the CRC checksum for the message data based on the second instruction.

Clause 2: The end-to-end CRC overhead hiding method of clause 1, further comprising: dividing a message into a plurality of data blocks, each of the plurality of data blocks storing an amount of message data to satisfy a threshold requirement for hiding a CRC computation; and accumulating a CRC message while computing a serialized communication of the message data by chaining executions of the first instruction and the second instruction for each of the plurality of data blocks while executing an instruction for a current CRC and a next data block of the plurality of data blocks to process.

Clause 3: The end-to-end CRC overhead hiding method of clauses 1-2, wherein overhead for executing a CRC instruction is hidden by performing the CRC instruction in parallel with execution of other instructions configured to execute in parallel.

Clause 4: The end-to-end CRC overhead hiding method of clauses 1-3, wherein the communication channel comprises a shared memory buffer of at least one of an autonomous vehicle (AV), a sensor system of an AV, or an on-board computing device of the AV, and the end-to-end CRC overhead hiding method further comprises: sending the CRC checksum with the serialized message data to a plurality of components via the shared memory buffer.

Clause 5: The end-to-end CRC overhead hiding method of clauses 1-4, further comprising: receiving the communication interleaving the CRC checksum within the serialized communication; obtaining a third instruction for deserializing the communication; obtaining a fourth instruction for computing the CRC checksum; and deserializing the communication based on the third instruction, while concurrently computing a new CRC checksum for the message data based on the fourth instruction.

Clause 6: The end-to-end CRC overhead hiding method of clauses 1-5, further comprising: comparing the new CRC checksum to the CRC checksum to determine whether data corruption has likely occurred; and in response to determining a data corruption has likely occurred, protecting against a fault in the shared memory buffer, by performing at least one of: notifying a sender, resending the communication, or recalculating the new CRC checksum.

Clause 7: The end-to-end CRC overhead hiding method of clauses 1-6, wherein the first instruction is a separate instruction from the second instruction, and wherein the first instruction and the second instruction each comprises a plurality of instructions.

Clause 8: The end-to-end CRC overhead hiding method of clauses 1-7, wherein the communication is an intra-processor communication.

Clause 9: An end-to-end cyclic redundancy check (CRC) overhead hiding system, comprising: a protected communication channel including at least one sender component and at least one receiver component from components of a system communicating via a shared memory buffer; and the at least one sender component configured to send one or more serialized communications to the receiver component, by controlling at least one processor to: access a data block storing message data; obtain a first instruction for serializing a communication; obtain a second instruction for computing a CRC checksum; and interleave the CRC checksum with serialized message data to generate a communication within a communication channel, by computing a serialized communication of the message data in the data block based on the first instruction, while concurrently computing the CRC checksum for the message data based on the second instruction.

Clause 10: The end-to-end CRC overhead hiding system of clause 9, wherein the at least one sender component is further configured to send one or more serialized communications to the receiver component, by controlling at least one processor to: divide a message into a plurality of data blocks, each of the plurality of data blocks storing an amount of message data to satisfy a threshold requirement for hiding a CRC computation; and accumulate a CRC message while computing a serialized communication of the message data by chaining executions of the first instruction and the second instruction for each of the plurality of data blocks while executing an instruction for a current CRC and a next data block of the plurality of data blocks to process.

Clause 11: The end-to-end CRC overhead hiding system of clauses 9-10, wherein overhead for executing a CRC instruction is hidden by performing the CRC instruction in parallel with execution of other instructions configured to execute in parallel.

Clause 12: The end-to-end CRC overhead hiding system of clauses 9-11, wherein the communication channel comprises a shared memory buffer of at least one of an autonomous vehicle (AV), a sensor system of an AV, or an on-board computing device of the AV, and sending the CRC checksum with the serialized message data to a plurality of components.

Clause 13: The end-to-end CRC overhead hiding system of clauses 9-12, wherein the receiver component is configured to receive one or more serialized communications, and is further configured to deserialize the one or more serialized communications from the at least one sender component, by controlling the at least one processor to: receive the communication interleaving the CRC checksum within the serialized communication; obtain a third instruction to deserialize the communication; obtain a fourth instruction for computing the CRC checksum; and deserialize the communication based on the third instruction, while concurrently computing a new CRC checksum for the message data based on the fourth instruction.

Clause 14: The end-to-end CRC overhead hiding system of clauses 9-13, wherein the receiver component is configured to: compare the new CRC checksum to the CRC checksum to determine whether data corruption has likely occurred; and in response to determining a data corruption has likely occurred, protect against a fault in the shared memory buffer, by performing at least one of: notifying a sender, resending the communication, or recalculating the new CRC checksum.

Clause 15: The end-to-end CRC overhead hiding system of clauses 9-14, wherein the first instruction is a separate instruction from the second instruction, and wherein the first instruction and the second instruction each comprises a plurality of instructions.

Clause 16: The end-to-end CRC overhead hiding system of clauses 9-15, wherein the communication is an intra-processor communication.

Clause 17: A non-transitory computer-readable medium having instructions stored thereon that, when executed by at least one computing device, cause the at least one computing device to: access a data block storing message data; obtain a first instruction for serializing a communication; obtain a second instruction for computing a cyclic redundancy check (CRC) checksum; and interleave the CRC checksum with serialized message data to generate a communication within a communication channel, by computing a serialized communication of the message data in the data block based on the first instruction, while concurrently computing the CRC checksum for the message data based on the second instruction.

Clause 18: The non-transitory computer-readable medium of clause 17, having further instructions stored thereon that, when executed by at least one computing device, cause the at least one computing device to: divide a message into a plurality of data blocks, each of the plurality of data blocks storing an amount of message data to satisfy a threshold requirement for hiding a CRC computation; and accumulate a CRC message while computing a serialized communication of the message data by chaining executions of the first instruction and the second instruction for each of the plurality of data blocks while executing an instruction for a current CRC and a next data block of the plurality of data blocks to process.

Clause 19: The non-transitory computer-readable medium of clauses 17-18, wherein overhead for executing a CRC instruction is hidden by performing the CRC instruction in parallel with execution of other instructions configured to execute in parallel.

Clause 20: The non-transitory computer-readable medium of clauses 17-19, wherein the communication channel comprises a shared memory buffer of at least one of an autonomous vehicle (AV), a sensor system of an AV, or an on-board computing device of the AV, and sending the CRC checksum with the serialized message data to a plurality of components.

These and other features and characteristics of the present disclosure, as well as, the methods of operation and functions of the related elements of structures and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the present disclosure.

BRIEF DESCRIPTION OF THE DRAWINGS

The accompanying drawings are incorporated herein and form a part of the specification.

FIG. 7 provides non-limiting embodiments or aspects of exemplary computer systems in which systems, apparatuses, and/or methods, as described herein, may be implemented.

In the drawings, like reference numbers generally indicate identical or similar elements. Additionally, generally, the left-most digit(s) of a reference number identifies the drawing in which the reference number first appears.

DETAILED DESCRIPTION

Figure 1:
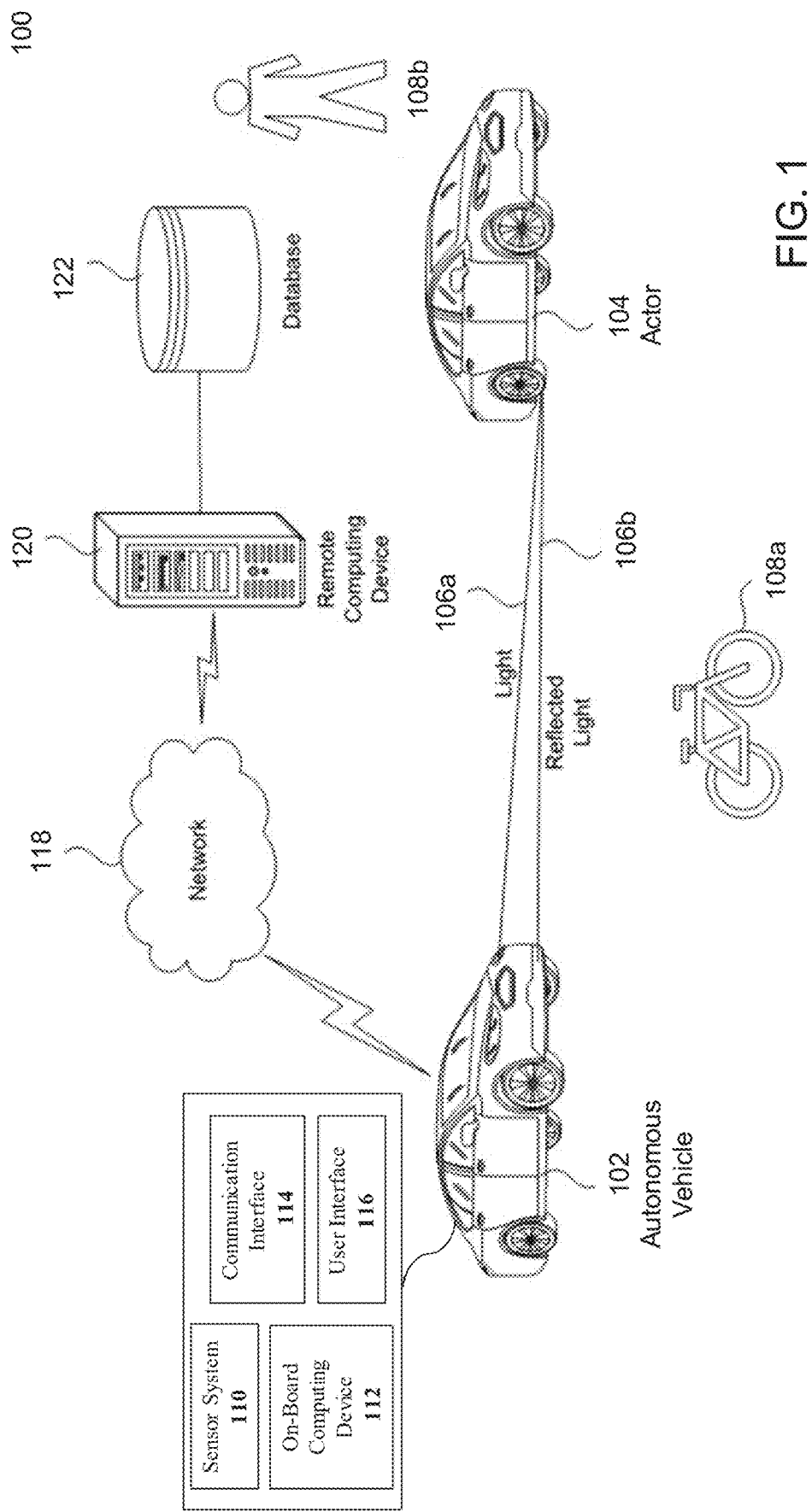
FIG. 1 is a diagram of non-limiting embodiments or aspects of an exemplary autonomous vehicle system, in accordance with aspects of the present disclosure.

Detection of data corruption, faults, and other issues with autonomy software and self-driving system (SDS) related communication channels provide benefits so that a fault is quickly handled or diagnosed. Such communication channels involve many elements across multiple layers of the software stack, including autonomy software, embedded software, infrastructure software, vehicle interface software, foundational and operating system software, and diverse detection pipelines to identify sensor failures, to monitor the different components of the autonomy software, and to detect a range of malfunctions.

A variety of computer applications operate on communications to create a cyclic redundancy check (CRC) checksum (e.g., a CRC residue). The CRC checksum can represent the data content of a communication using a compact number of bits. Among other uses, communication residues are frequently used to determine whether data transmitted over network connections or retrieved from a storage device may have been corrupted. For instance, a noisy transmission line may change a "0" signal to a "1" signal, or vice versa, thereby corrupting the communication. A common error detecting code for communications (e.g., comms, messages, etc.) is known as a CRC. A CRC computation is based on interpreting a stream of communication bits as coefficients of a polynomial. CRC codes may be used. A CRC is widely used for integrity checking of communication channels in devices such as storage and networking. However, with the large number of communications needed for protection of an autonomous vehicle (AV) (e.g., to calculate a checksum on transmission of a communication, to verify a checksum on receipt of a communication, etc.), there is an ever-increasing need for high-speed CRC computations to perform end-to-end integrity checks of communication channels in the SDS.

For example, the CRC code is computed and included with a communication as a checksum on transmission of a message which can then be reproduced on reception to verify the correctness of the message, thereby detecting an issue in the SDS if the data is subject to a fault or other corruption. However, the calculation of the checksum on transmission and reception normally adds significantly to the communication latency and consumes valuable compute resources. Resources used by calculating a CRC reduce the resources that can be used to improve the safety of the intended vehicle behavior (SOTIF).

However, existing systems, generally read data byte by byte from memory (e.g., computationally intensive), calculate and compute the CRC residue, write out the CRC to memory and then finish with other intensive processing, such as, for example, reading everything into memory again (e.g. byte by byte), marshal everything (e.g. byte by byte), and then write out the marshaling (e.g. byte by byte). Accordingly, two passes are needed, and whether serializing or deserializing, they are both expensive and can add additional pressure to the SDS system and the AV, using significant amounts of resources just for reading that could be used in other parts of the autonomy system.

In some systems, such as disclosed by Gopal et al., in the paper titled "Fast CRC Computation for iSCSI Polynomial Using CRC32 Instruction", 2011, Intel, a latency reduction has been shown for the CRC calculation based on hardware support for faster calculation of CRC checksums. For example, a CRC instruction provided by CPU cores of the processor can calculate the CRC for a sequence of data words with three cycles per data word, but can calculate three such blocks concurrently due to the superscalar microarchitecture. However, the Fast CRC Computation described by Gopal still contributes in a significant way to an overhead for the channel and is not feasible for AV communication channels.

The present disclosure provides an improved method, system, and computer program product for end-to-end CRC overhead hiding, such as by concealing the calculation time of the CRC checksum within the execution time of the serialization algorithm and verifying the checksum within the execution time of the deserialization algorithm in a superscalar microarchitecture that can help eliminate overhead due to communication protection and allow for pervasive protection of communications throughout autonomy software.

For purposes of the description hereinafter, the terms "end," "upper," "lower," "right," "left," "vertical," "horizontal," "top," "bottom," "lateral," "longitudinal," and derivatives thereof shall relate to the disclosure as it is oriented in the drawing figures. However, it is to be understood that the disclosure may assume various alternative variations and step sequences, except where expressly specified to the contrary. It is also to be understood that the specific devices and processes illustrated in the attached drawings, and described in the following specification, are simply exemplary embodiments or aspects of the disclosure. Hence, specific dimensions and other physical characteristics related to the embodiments or aspects of the embodiments or aspects disclosed herein are not to be considered as limiting unless otherwise indicated. In addition, terms of relative position, such as, "vertical" and "horizontal", "ahead" and "behind", or "front" and "rear", when used, are intended to be relative to each other and need not be absolute, and only refer to one possible position of the device associated with those terms depending on the device's orientation.

No aspect, component, element, structure, act, step, function, instruction, and/or the like used herein should be construed as critical or essential unless explicitly described as such. Also, as used herein, the articles "a" and "an" are intended to include one or more items, and may be used interchangeably with "one or more" and "at least one." Furthermore, as used herein, the term "set" is intended to include one or more items (e.g., related items, unrelated items, a combination of related and unrelated items, and/or the like) and may be used interchangeably with "one or more" or "at least one." Where only one item is intended, the term "one" or similar language is used. Also, as used herein, the terms "has," "have," "having," or the like are intended to be open-ended terms. Further, the phrase "based on" is intended to mean "based at least partially on" unless explicitly stated otherwise. Additionally, when terms, such as, "first" and "second" are used to modify a noun, such use is simply intended to distinguish one item from another, and is not intended to require a sequential order unless specifically stated.

In some non-limiting embodiments or aspects, one or more aspects may be described herein, in connection with thresholds (e.g., a tolerance, a tolerance threshold, etc.). As used herein, satisfying a threshold may refer to a value (e.g., a score, an objective score, etc.) being greater than the threshold, more than the threshold, higher than the threshold, greater than or equal to the threshold, less than the threshold, fewer than the threshold, lower than the threshold, less than or equal to the threshold, equal to the threshold, etc.

As used herein, the terms "communication" and "communicate" may refer to the reception, receipt, transmission, transfer, provision, and/or the like of information (e.g., data, signals, messages, instructions, commands, and/or the like). For one component (e.g., a unit, a device, a system, an element, or a component of a device or system, combinations thereof, and/or the like) to be in communication with another component means that the one component is able to directly or indirectly receive information from and/or send (e.g., transmit) information to the other component. This may refer to a direct or indirect connection that is wired and/or wireless in nature. Additionally, two components may be in communication with each other even though the information transmitted may be modified, processed, relayed, and/or routed between the first and second component. For example, a first component may be in communication with a second component even though the first component passively receives information and does not actively send information to the second component. As another example, a first component may be in communication with a second component if at least one intermediary component (e.g., a third component located between the first component and the second component) processes information received from the first component and sends the processed information to the second component. In some non-limiting embodiments or aspects, a message may refer to a network packet (e.g., a data packet and/or the like) that includes data.

As used herein, the term "computing device", "electronic device", or "computer" may refer to one or more electronic devices configured to process data. A computing device may, in some examples, include the necessary components to receive, process, and output data, such as, a processor, a display, a memory, an input device, a network interface, and/or the like. A computing device may be included in a device on-board an AV. As an example, a computing device may include an on-board specialized computer (e.g., a sensor, a controller, a data store, a communication interface, a display interface, etc.), a mobile device (e.g., a smartphone, standard cellular phone, or integrated cellular device), a portable computer, a wearable device (e.g., watches, glasses, lenses, clothing, and/or the like), a personal digital assistant (PDA), and/or other like devices. A computing device may also be a desktop computer or other form of non-mobile computer.

As used herein, the terms "client", "client device", and "remote device" may refer to one or more computing devices that access a service made available by a server. In some non-limiting embodiments or aspects, a "client device" may refer to one or more devices that facilitate a maneuver by an AV, such as, one or more remote devices communicating with an AV. In some non-limiting embodiments or aspects, a client device may include a computing device configured to communicate with one or more networks and/or facilitate vehicle movement, such as, but not limited to, one or more vehicle computers, one or more mobile devices, and/or other like devices.

As used herein, the term "server" may refer to or include one or more computing devices that are operated by or facilitate communication and processing for multiple parties in a network environment, such as, the Internet, although it will be appreciated that communication may be facilitated over one or more public or private network environments and that various other arrangements are possible. Further, multiple computing devices (e.g., servers, data stores, controllers, communication interfaces, mobile devices, and/or the like) directly or indirectly communicating in the network environment may constitute a "system." The terms "processor" and "processing device" refer to a hardware component of an electronic device that is configured to execute programming instructions. Except where specifically stated otherwise, the singular term "processor" or "processing device" is intended to include both single-processing device embodiments and embodiments in which multiple processing devices together or collectively perform a process. Reference to "a server" or "a processor," as used herein, may refer to a previously-recited server and/or processor that is recited as performing a previous step or function, a different server and/or processor, and/or a combination of servers and/or processors. For example, as used in the specification and the claims, a first server and/or a first processor that is recited as performing a first step or function may refer to the same or different server and/or a processor recited as performing a second step or function.

As used herein, the term "system" may refer to one or more computing devices or combinations of computing devices, such as, but not limited to, processors, servers, client devices, sensors, software applications, and/or other like components. In addition, reference to "a server" or "a processor," as used herein, may refer to a previously-recited server and/or processor that is recited as performing a previous step or function, a different server and/or processor, and/or a combination of servers and/or processors. For example, as used in the specification and the claims, a first server and/or a first processor that is recited as performing a first step or function may refer to the same or different server and/or a processor recited as performing a second step or function. The terms "memory," "memory device," "data store," "data storage facility," and the like each refer to a non-transitory device on which computer-readable data, programming instructions, or both are stored. Except where specifically stated otherwise, the terms "memory," "memory device," "data store," "data storage facility," and the like are intended to include single device embodiments, embodiments in which multiple memory devices together or collectively store a set of data or instructions, as well as, individual sectors within such devices.

According to some non-limiting embodiments, the term "vehicle" refers to any moving form of conveyance that is capable of carrying either one or more human occupants and/or cargo and is powered by any form of energy. The term "vehicle" includes, but is not limited to, cars, trucks, vans, trains, AVs, aircraft, aerial drones, and the like. An AV is a vehicle having a processor, programming instructions, and drivetrain components that are controllable by the processor without requiring a human operator. An AV may be fully autonomous in that it does not require a human operator for most or all driving conditions and functions, or it may be semi-autonomous in that a human operator may be required in certain conditions or for certain operations, or that a human operator may override the vehicle's autonomous system and may take control of the vehicle. The AV can be a ground-based AV (e.g., car, truck, bus, etc.), an air-based AV (e.g., airplane, drone, helicopter, or other aircraft), or other types of vehicles (e.g., watercraft).

As used herein, a "superscalar" processor is a specific type of microprocessor that uses instruction-level parallelism to execute more than one instruction during a clock cycle, and depends on analysis of the instructions to be carried out and the use of multiple execution units to triage these instructions. Superscalar is different from scalar processors (e.g., which can execute at most one single instruction per clock cycle), because the execution units are not separate processors, and a superscalar processor can execute more than one instruction during a clock cycle by simultaneously dispatching multiple instructions to different execution units on the processor. It, therefore, allows more throughput (the number of instructions that can be executed in a unit of time) than would otherwise be possible at a given clock rate. Each execution unit is not a separate processor (or a core if the processor is a multi-core processor), but an execution resource within a single CPU such as an arithmetic logic unit.

As used herein, "serialization" is the process of translating message data as seen and processed by the application software into a byte stream that can be used for transportation on a communication channel. During serialization, a data object (e.g., a combination of code and data represented within a region of data storage, a container structure having a value or group of values that can be accessed using its identifier or a more complex expression that refers to the object or the object in combination with a value stored therein, etc.) is translated (e.g., converted, transformed, etc.) into a series of bytes that preserves (e.g., saves, keeps, etc.) the state of the object in an easily transmittable form. In this serialized form (e.g., a stream of bytes, etc.), the data can be delivered (e.g., sent, transmitted, communicated) to another node (e.g., a different piece of the SDS), a data store (such as an in-memory computing platform), an application, or some other destination (e.g., a data cloud, a device, etc.). Deserialization is the reverse process (e.g., constructing a data structure or object from a series of bytes, etc.) recreates the object from the stream of serialized data received or obtained, thus making the data accessible (e.g., easier, etc.) to read and modify as a native structure in a programming language. Serialization and deserialization are used to transform and recreate data objects to/from a portable format, such as a stream (e.g., streaming data is data that is generated continuously by many data sources within the SDS or AV, which typically transmits or sends data records simultaneously, and in small sizes (order of kilobytes), enabling storage of the state of an object and recreation of the object in a new location. Serialization encompasses both the storage of the object, processing, and exchange of data, and requires significant processing effort to transfer from application to application via transmission services and/or protocols (e.g., REST APIs, JSON, XML strings), to other data stores, to identify changes in data over time, serialization for use cases such as key/value objects for position, location, or coordinates of a map, putting items into a queue, set, or list, transmitting functions between SDS subsystems, processing or sharing an entry within a map with SDS subsystems, locking an object, sending a message to a device, component, element, or SDS subsystem, via an object-oriented programming language (e.g., Java, .NET, C++, Node.js, Python, Go, etc.), and stored using data formats such as JSON, XML, or binary formats.

As used herein, the terms "trajectory" and "trajectories" may refer to a path (e.g., a path through a geospatial area, etc.) with positions of the AV along the path with respect to time, where a "path" generally implies a lack of temporal information, such as one or more paths for navigating an AV in a roadway for controlling travel of the AV on the roadway. A trajectory may be associated with a map of a geographic area including the roadway. In such an example, the path may traverse a roadway, an intersection, another connection or link of the road with another road, a lane of the roadway, objects in proximity to and/or within the road, and/or the like. For example, a trajectory may define a path of travel on a roadway for an AV that follows each of the rules (e.g., the path of travel does not cross a yellow line, etc.) associated with the roadway. In such an example, an AV that travels over or follows the trajectory (e.g., that travels on the roadway without deviating from the trajectory, etc.) may obey each of the rules or account for constraints (e.g., objects in the roadway, does not cross the yellow line, etc.) associated with the roadway.

As used herein, "map data" and "sensor data" includes data associated with a road (e.g., an identity and/or a location of a roadway of a road, an identity and/or location of a segment of a road, etc.), data associated with an object in proximity to a road (e.g., a building, a lamppost, a crosswalk, a curb of the road, etc.), data associated with a lane of a roadway (e.g., the location and/or direction of a travel lane, a parking lane, a turning lane, a bicycle lane, etc.), data associated with traffic control of a road (e.g., the location of and/or instructions associated with lane markings, traffic signs, traffic lights, etc.), and/or the like. According to some non-limiting embodiments, a map of a geographic location (or area) includes one or more routes (e.g., a nominal route, a driving route, etc.) that include one or more roadways. According to some non-limiting embodiments or aspects, map data associated with a map of the geographic location associates the one or more roadways with an indication of whether an AV can travel on that roadway. As used herein, "sensor data" includes data from one or more sensors. For example, sensor data may include light detection and ranging (LiDAR) point cloud maps (e.g., map point data, etc.) associated with a geographic location (e.g., a location in three-dimensional space relative to the LiDAR system of a mapping vehicle in one or more roadways) of a number of points (e.g., a point cloud) that correspond to objects that have reflected a ranging laser of one or more mapping vehicles at the geographic location (e.g. an object such as a vehicle, a bicycle, a pedestrian, etc. in the roadway). As an example, sensor data may include LiDAR point cloud data that represents objects in the roadway, such as, other vehicles, pedestrians, cones, debris, and/or the like.

As used herein, a "road" refers to a paved or an otherwise improved path between two places that allows for travel by a vehicle (e.g., AV). Additionally or alternatively, a road includes a roadway and a sidewalk in proximity to (e.g., adjacent, near, next to, abutting, touching, etc.) the roadway. In some non-limiting embodiments or aspects, a roadway includes a portion of a road on which a vehicle is intended to travel and is not restricted by a physical barrier or by separation so that the vehicle is able to travel laterally. Additionally or alternatively, a roadway (e.g., a road network, one or more roadway segments, etc.) includes one or more lanes in which a vehicle may operate, such as, a travel lane (e.g., a lane upon which a vehicle travels, a traffic lane, etc.), a parking lane (e.g., a lane in which a vehicle parks), a turning lane (e.g., a lane in which a vehicle turns from), and/or the like. Additionally or alternatively, a roadway includes one or more lanes in which a pedestrian, a bicycle, or other vehicle may travel, such as, a crosswalk, a bicycle lane (e.g., a lane in which a bicycle travels), a mass transit lane (e.g., a lane in which a bus may travel), and/or the like. According to some non-limiting embodiments, a roadway is connected to another roadway to form a road network, for example, a lane of a roadway is connected to another lane of the roadway and/or a lane of the roadway is connected to a lane of another roadway. In some non-limiting embodiments, an attribute of a roadway includes a road edge of a road (e.g., a location of a road edge of a road, a distance of location from a road edge of a road, an indication whether a location is within a road edge of a road, etc.), an intersection, connection, or link of a road with another road, a roadway of a road, a distance of a roadway from another roadway (e.g., a distance of an end of a lane and/or a roadway segment or extent to an end of another lane and/or an end of another roadway segment or extent, etc.), a lane of a roadway of a road (e.g., a travel lane of a roadway, a parking lane of a roadway, a turning lane of a roadway, lane markings, a direction of travel in a lane of a roadway, etc.), one or more objects (e.g., a vehicle, vegetation, a pedestrian, a structure, a building, a sign, a lamppost, signage, a traffic sign, a bicycle, a railway track, a hazardous object, etc.) in proximity to and/or within a road (e.g., objects in proximity to the road edges of a road and/or within the road edges of a road), a sidewalk of a road, and/or the like.

As used herein, navigating (e.g., traversing, driving, etc.) a route may involve the creation of at least one trajectory or path through the road network and may include any number of maneuvers or an evaluation of any number of maneuvers (e.g., a simple maneuver, a complex maneuver, etc.), such as, a maneuver involving certain driving conditions, such as, dense traffic, where successfully completing a lane change may require a complex maneuver, like speeding up, slowing down, stopping, or abruptly turning, for example, to steer into an open space between vehicles, pedestrians, or other objects (as detailed herein) in a destination lane. Additionally, in-lane maneuvers may also involve an evaluation of any number of maneuvers, such as, a maneuver to traverse a lane split, an intersection (e.g., a three-leg, a four-leg, a multi-leg, a roundabout, a T-junction, a Y-intersection, a traffic circle, a fork, turning lanes, a split intersection, a town center intersection, etc.), a travel lane (e.g., a lane upon which a vehicle travels, a traffic lane, etc.), a parking lane (e.g., a lane in which a vehicle parks), a bicycle lane (e.g., a lane in which a bicycle travels), a turning lane (e.g., a lane from which a vehicle turns, etc.), merging lanes (e.g., two lanes merging to one lane, one lane ends and merges into a new lane to continue, etc.), and/or the like. Maneuvers may also be based on current traffic conditions that may involve an evaluation of any number of maneuvers, such as, a maneuver based on a current traffic speed of objects in the roadway, a current traffic direction (e.g., anti-routing traffic, wrong-way driving, or counter flow driving, where a vehicle is driving against the direction of traffic and/or against the legal flow of traffic), current accidents or other incidents in the roadway, weather conditions in the geographic area (e.g., rain, fog, hail, sleet, ice, snow, etc.), or road construction projects. In addition, maneuvers may also involve an evaluation of any number of objects in and around the roadway, such as, a maneuver to avoid an object in proximity to a road, such as, structures (e.g., a building, a rest stop, a toll booth, a bridge, etc.), traffic control objects (e.g., lane markings, traffic signs, traffic lights, lampposts, curbs of the road, gully, a pipeline, an aqueduct, a speedbump, a speed depression, etc.), a lane of a roadway (e.g., a parking lane, a turning lane, a bicycle lane, etc.), a crosswalk, a mass transit lane (e.g., a travel lane in which a bus, a train, a light rail, and/or the like may travel), objects in proximity to and/or within a road (e.g., a parked vehicle, a double parked vehicle, vegetation, a lamppost, signage, a traffic sign, a bicycle, a railway track, a hazardous object, etc.), a sidewalk of a road, and/or the like.

In some non-limiting embodiments or aspects, an AV includes multiple processors which operate many components (e.g., perception, prediction, motion planning, route planning related, AV control, state control, etc.) in the AV, the components may be associated to a particular processor and/or operate within (e.g., across, etc.) or in association with multiple different processors of the AV, and transmits and receives communications sent between components within a processor, between components across different processors, or between devices (e.g., sensors, computing devices, AV hardware, AV devices, etc.) and a processor, and/or the like, such that within each processor, the communication channel can get corrupted.

When applied incorrectly, protection of communications may be extremely process intensive, may add substantial processing overhead, and may take processing cycles that could otherwise be used by the AV for executing processes of the autonomy software and the SDS. Such overhead and expense is not acceptable, nor feasible. Also, the additional time needed in existing systems at each of the individual steps because of overhead processing may undermine guarantees of latency requirements for subsystems and the overarching system itself. End-to-end protection normally applies computationally expensive checksums and sequence checkers to counter, often limiting use to critical systems or those specifically targeted, and more robust protection and checking requires even more expensive processing.

Provided are improved systems, methods, and computer program products for controlling an AV with end-to-end protection of AV communication channels including at least one sender component and at least one receiver component from components of an AV system communicating via a shared memory buffer. The at least one sender component can be configured to send one or more serialized communications to the receiver component by controlling at least one processor to: access a data block storing message data; obtain a first instruction for serializing a communication; obtain a second instruction for computing a CRC checksum; and interleave the CRC checksum with serialized message data to generate a communication within a communication channel, by computing a serialized communication of the message data in the data block based on the first instruction, while concurrently computing the CRC checksum for the message data based on the second instruction.

In this way, protection of communication channels, protection against failures of hardware, and protection of operating systems become a crucial part of an AV. In some non-limiting embodiments or aspects, end-to-end CRC overhead hiding provides end-to-end protection to eliminate and/or detect corrupted hardware, hardware faults, other issues existing in components of the AV (as described and shown with reference to FIG. 2), SDS functions of perception, motion planning, route planning, AV control, state control, and/or the like in the AV (as described and shown with reference to FIG. 6). End-to-end CRC provides end-to-end protection to eliminate and/or detect hardware and software components which do not execute as planned or when operating software causes corruption.

According to the systems, methods, and computer program products described herein, pervasive, comprehensive, and continuous application of end-to-end protection without the extremely expensive overhead of existing systems more sufficiently eliminates or minimizes additional latency which is added to the normal communication overhead between components so as to help reduce or eliminate computational overload. Implementing end-to-end CRC overhead hiding can protect the AV against hardware and software failures, protect the operating system, which is a critical aspect of communications protection system, protect diagnostics end-to-end, which depend heavily on diagnostic signals that inform the system of AV status, location, and pose, enabling the AV to more efficiently determine vehicle status (e.g., over 10K diagnostic signals), and additionally eliminate processor time for each communication, and thereby eliminating overhead for each 10 ms or so of processing time for each calculation, thereby enabling efficient implementation of end-to-end protection.

The improved systems, methods, and computer program products can also help to reduce or eliminate corruption of diagnostic data and interference from memory or operating system faults that must be detected and/or protected against for the integrity of the diagnostics and other communications, and, by hiding the overhead for end-to-end protection enables additional functionality to operate more accurately and efficiently in the AV using the extra overhead recovered from the CRC hiding, while protecting communications, thereby the additional cycles freed provide overhead that may be used by the AV for more accurately and efficiently planning, routing, and controlling the AV.

Finally, end-to-end protection is provided by CRC for communications between senders and receivers, for processes, diagnostic communications, and/or communications sent to multiple receivers simultaneously (e.g., software component to software component, software component to diagnostic system, diagnostic system to software component, etc.) using a CRC of a size that can guarantee integrity while providing end-to-end protection of shared memory buffers to eliminate and/or detect faults. This may provide end-to-end protection against faults in communications which can be corrupted by dram faults, created by non-safety operating system issues, such as a bug in the operating system code (e.g., one or more bugs in an AV OS, one or more bugs in an application, etc.) that causes a corruption of the communication buffer (e.g., when a function of the operating system erroneously writes into a buffer, such as by operating system code that is executed with privileges that may generate erroneous writes), and/or the like.

In some non-limiting embodiments or aspects, according to aspects of the present disclosure, the improved methods and systems of the present disclosure may leverage superscalar aspects (e.g., ARM, Intel, etc.) in a novel way, such that, instead of merely accelerating the CRC calculation, the CRC calculation is interleaved with a serialization algorithm, and in this way, while the serialization algorithm utilizes the execution units of the CPU cores for serializing data stored in the shared buffer to generate a stream of data for transmission, the CRC instruction is executed concurrently (i.e., to the serialization) to perform a CRC computation for the same data of the shared buffer. The result is that the CRC computation (e.g., accumulation) is more efficiently calculated without any overhead, thus avoiding any latency creeping into the communication process. In addition, this new approach integrates the CRC instructions into the serialization code, such that the CRC instruction can be executed concurrently with other instructions (e.g., serialization, deserialization, etc.) when received at other points in the SDS communication network and therefore does not add any latency to the communication process.

FIG. 1 provides one non-limiting embodiment of system 100 in which devices, systems, and/or methods, herein, may be implemented. System 100 comprises autonomous vehicle 102 (AV 102) that is traveling along a road in a semi-autonomous or autonomous manner. AV 102 is also referred to herein as vehicle 102.

AV 102 is generally configured to detect objects in the roadway, such as actor 104, bicyclist 108a, and pedestrian 108b in proximity thereto. The objects can include, but are not limited to, a vehicle, such as actor 104, bicyclist 108a (e.g., a rider of a bicycle, an electric scooter, a motorcycle, or the like) and/or pedestrian 108b. Actor 104 may be an autonomous vehicle, a semi-autonomous vehicle, or alternatively, a non-autonomous vehicle controlled by a driver.

As illustrated in FIG. 1, AV 102 may include sensor system 110, on-board computing device 112, communication interface 114, and user interface 116. AV 102 may further include certain components (as illustrated, for example, in FIG. 2) included in vehicles, which may be controlled by on-board computing device 112 using a variety of communication signals and/or commands, such as, for example, acceleration signals or commands, deceleration signals or commands, steering signals or commands, braking signals or commands, etc.

Figure 2:
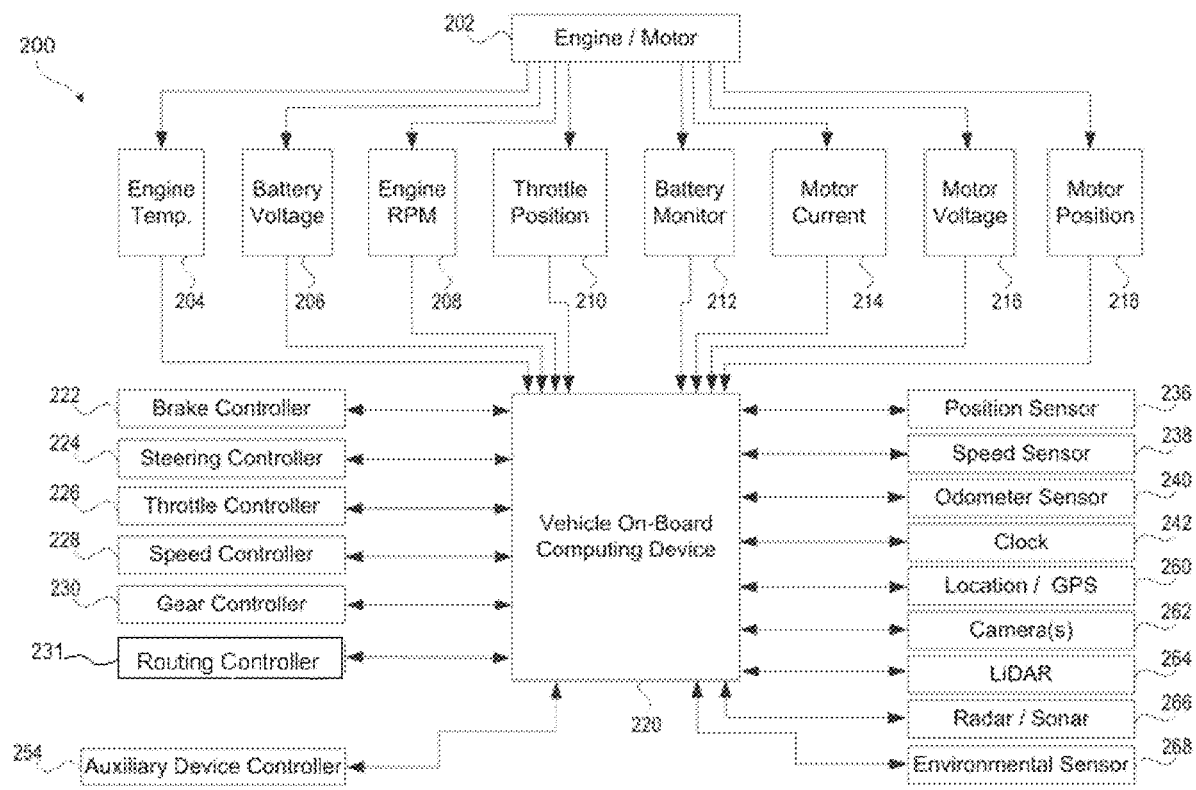
FIG. 2 is a diagram of non-limiting embodiments or aspects of an exemplary architecture for a vehicle in which end-to-end cyclic redundancy check (CRC) overhead hiding, as described herein, may be implemented to protect communications.

Sensor system 110 may include one or more sensors that are coupled to and/or are included within AV 102, as illustrated in FIG. 2. For example, such sensors may include, without limitation, a laser detection system, a radio detection and ranging (RADAR) system, a light detection and ranging (LiDAR) system, a sound navigation and ranging (SONAR) system, one or more cameras (e.g., visible spectrum cameras, infrared cameras, etc.), temperature sensors, position sensors (e.g., global positioning system (GPS), etc.), location sensors, fuel sensors, motion sensors (e.g., inertial measurement units (IMU), etc.), humidity sensors, occupancy sensors, and/or the like. The sensor data can include information that describes the location of objects within the surrounding environment of AV 102, information about the environment itself, information about the motion of AV 102, information about a route of AV 102, and/or the like. As AV 102 moves over a surface, at least some of the sensors may collect data pertaining to the surface.

In some non-limiting embodiments or aspects, one or more processors of AV 102 can send a communication protected by end-to-end CRC overhead hiding that includes sensor information identifying a location of objects within the surrounding environment of AV 102, information describing the environment itself, information about the motion of AV 102, information about a route of AV 102, information about a position of AV 102 (or other objects in the roadway) while traversing a route of AV 102 and/or the like. As AV 102 moves over a surface, at least some of the sensors may collect data pertaining to the surface.

As will be described in greater detail, AV 102 may be configured with a LiDAR system (e.g., LiDAR 264 of FIG. 2.) The LiDAR system may be configured to transmit light pulse 106a to detect objects located within a distance or range of distances of AV 102. Light pulse 106a may be incident on one or more objects (e.g., actor 104, bicyclist 108a, pedestrian 108b) and be reflected back to the LiDAR system. Reflected light pulse 106b incident on the LiDAR system may be processed to determine a distance of that object to AV 102. Reflected light pulse 106b may be detected using, in some non-limiting embodiments, a photodetector or array of photodetectors positioned and configured to receive the light reflected back into the LiDAR system. LiDAR information, such as detected object data, is communicated from the LiDAR system to on-board computing device 112 (e.g., one or more processors of AV 102, vehicle on-board computing device 220 of FIG. 2, etc.). AV 102 may also communicate LiDAR data to remote computing device 120 (e.g., cloud processing system) over communications network 118. Remote computing device 120 may be configured with one or more servers to process one or more processes of the technology described herein. Remote computing device 120 may also be configured to communicate data/instructions to/from AV 102 over network 118, to/from server(s) and/or database(s) 122.

In some non-limiting embodiments or aspects, LiDAR systems for collecting data pertaining to the surface may be included in systems other than AV 102, such as, without limitation, other vehicles (autonomous or driven), mapping vehicles, robots, satellites, etc.

Network 118 may include one or more wired or wireless networks. For example, network 118 may include a cellular network (e.g., a long-term evolution (LTE) network, a code division multiple access (CDMA) network, a 3G network, a 4G network, a 5G network, another type of next generation network, etc.). The network may also include a public land mobile network (PLMN), a local area network (LAN), a wide area network (WAN), a metropolitan area network (MAN), a telephone network (e.g., the Public Switched Telephone Network (PSTN)), a private network, an ad hoc network, an intranet, the Internet, a fiber optic-based network, a cloud computing network, and/or the like, and/or a combination of these or other types of networks.

AV 102 may retrieve, receive, display, and edit information generated from a local application or obtain track data, confidence level logic, optimizing data, association data, information, and/or the like, delivered via network 118 from database 122. Database 122 may be configured to store and supply raw data, indexed data, structured data, map data, program instructions, or other configurations as is known.

Communication interface 114 may be configured to allow communication between AV 102 and external systems, such as, for example, external devices, sensors, other vehicles, servers, data stores, databases, and/or the like. Communications interface 114 may utilize any now or hereafter known protocols, protection schemes, encodings, formats, packaging, etc. such as, without limitation, Wi-Fi, an infrared link, Bluetooth, etc. User interface 116 may be part of peripheral devices implemented within AV 102 including, for example, a keyboard, a touch screen display device, a microphone, and a speaker, etc.

Referring now to FIG. 2, FIG. 2 illustrates an exemplary system architecture 200 for a vehicle, in accordance with aspects of the disclosure. AV 102 (or vehicles 104) of FIG. 1 can have the same or similar system architecture as that shown in FIG. 2. Thus, the following discussion of system architecture 200 is sufficient for understanding vehicle(s) 102 and 104 of FIG. 1. However, other types of vehicles are considered within the scope of the technology described herein and may contain more or less elements as described in association with FIG. 2. As a non-limiting example, an airborne vehicle may exclude brake or gear controllers, but may include an altitude sensor. In another non-limiting example, a water-based vehicle may include a depth sensor. One skilled in the art will appreciate that other propulsion systems, sensors, and controllers may be included based on a type of vehicle, as is known.

As shown in FIG. 2, system architecture 200 of AV 102 includes an engine or motor 202 and various sensors 204-218 for measuring various parameters of the vehicle. In gas-powered or hybrid vehicles having a fuel-powered engine, the sensors may include, for example, engine temperature sensor 204, battery voltage sensor 206, engine Rotations per Minute (RPM) sensor 208, and throttle position sensor 210. If the vehicle is an electric or hybrid vehicle, then the vehicle may have an electric motor, and accordingly includes sensors such as battery monitoring system 212 (to measure current, voltage and/or temperature of the battery), motor current 214, motor voltage 216 sensors, and motor position sensors 218 such as resolvers and encoders.

Operational parameter sensors that are common to both types of vehicles include, for example: position sensor 236 such as an accelerometer, gyroscope and/or inertial measurement unit; speed sensor 238; and odometer sensor 240. The vehicle also may have clock 242 that the system uses to determine vehicle time during operation. Clock 242 may be encoded into vehicle on-board computing device 220, it may be a separate device or multiple clocks may be available.

The vehicle also includes various sensors that operate to gather information about the environment in which the vehicle is traveling. These sensors may include, for example: location sensor 260 (e.g., a Global Positioning System (GPS) device); object detection sensors such as one or more cameras 262; LiDAR 264; and/or radar and/or sonar system 266. The sensors also may include environmental sensors 268 such as a precipitation sensor and/or ambient temperature sensor. The object detection sensors may enable the vehicle to detect objects that are within a given distance range of the vehicle (e.g., AV 102) in any direction, while the environmental sensors collect data about environmental conditions within the vehicle's area of travel.

During operations, information is communicated from the sensors to vehicle on-board computing device 220. Vehicle on-board computing device 220 is implemented using the computer system of FIG. 6. Vehicle on-board computing device 220 analyzes the data captured by the sensors and optionally controls operations of the vehicle based on results of the analysis. For example, vehicle on-board computing device 220 may control one or more of: braking via brake controller 222; direction via steering controller 224; speed and acceleration via throttle controller 226 (in a gas-powered vehicle) or motor speed controller 228 (such as a current level controller in an electric vehicle); differential gear controller 230 (in vehicles with transmissions); other controllers, and/or the like. Auxiliary device controller 254 may be configured to control one or more auxiliary devices, such as testing systems, auxiliary sensors, mobile devices transported by the vehicle, and/or the like.

Geographic location information may be communicated from location sensor 260 to vehicle on-board computing device 220, which may then access a map of the environment that corresponds to the location information to determine known fixed features of the environment such as streets, buildings, stop signs, and/or stop/go signals. Captured images from cameras 262 and/or object detection information captured from sensors such as LiDAR 264 is communicated from those sensors to vehicle on-board computing device 220. The object detection information and/or captured images are processed by vehicle on-board computing device 220 to detect objects in proximity to vehicle 102 (or AV 102). Any known or to be known technique for making an object detection based on sensor data and/or captured images can be used in the embodiments disclosed herein.

LiDAR information is communicated from LiDAR 264 to vehicle on-board computing device 220. Additionally, captured images are communicated from camera(s) 262 to vehicle on-board computing device 220. The LiDAR information and/or captured images are processed by vehicle on-board computing device 220 to detect objects in proximity to vehicle 102 (or AV 102). The manner in which the object detections are made by vehicle on-board computing device 220 includes such capabilities detailed in this disclosure.

Vehicle on-board computing device 220 may include and/or may be in communication with routing controller 231 that generates a navigation route from a start position to a destination position for an autonomous vehicle. Routing controller 231 may access a map data store to identify possible routes and road segments that a vehicle can travel on to get from the start position to the destination position. Routing controller 231 may score the possible routes and identify a preferred route to reach the destination. For example, routing controller 231 may generate a navigation route that minimizes Euclidean distance traveled or other cost function during the route, and may further access the traffic information and/or estimates that can affect an amount of time it will take to travel on a particular route. Depending on implementation, routing controller 231 may generate one or more routes using various routing methods, such as Dijkstra's algorithm, Bellman-Ford algorithm, or other algorithms. Routing controller 231 may also use the traffic information to generate a navigation route that reflects expected conditions of the route (e.g., current day of the week or current time of day, etc.), such that a route generated for travel during rush-hour may differ from a route generated for travel late at night. Routing controller 231 may also generate more than one navigation route to a destination and send more than one of these navigation routes to a user for selection by the user from among various possible routes.

In various embodiments, vehicle on-board computing device 220 may determine perception information of the surrounding environment of AV 102. Based on the sensor data provided by one or more sensors and location information that is obtained, vehicle on-board computing device 220 may determine perception information of the surrounding environment of AV 102. The perception information may represent detected objects that an ordinary driver would perceive in the surrounding environment of a vehicle. The perception data may include information relating to one or more objects in the environment of AV 102. For example, vehicle on-board computing device 220 may process sensor data (e.g., LiDAR or RADAR data, camera images, etc.) in order to identify objects and/or features in the environment of AV 102. The objects may include traffic signals, road way boundaries, other vehicles, pedestrians, and/or obstacles, etc. Vehicle on-board computing device 220 may use any now or hereafter known object recognition algorithms, video tracking algorithms, and computer vision algorithms (e.g., track objects frame-to-frame iteratively over a number of time periods) to determine the perception.

In some non-limiting embodiments, vehicle on-board computing device 220 may also determine, for one or more identified objects in the environment, the current state of the object. The state information may include, without limitation, for each object: current location; current speed and/or acceleration: current heading; current pose; current shape, size, or footprint; type (e.g., vehicle vs. pedestrian vs. bicycle vs. static object or obstacle); and/or other state information.

Vehicle on-board computing device 220 may perform one or more prediction and/or forecasting operations. For example, vehicle on-board computing device 220 may predict future locations, trajectories, and/or actions of one or more objects. For example, vehicle on-board computing device 220 may predict the future locations, trajectories, and/or actions of the objects based at least in part on perception information (e.g., the state data for each object comprising an estimated shape and pose determined as discussed below), location information, sensor data, and/or any other data that describes the past and/or current state of the objects, AV 102, the surrounding environment, and/or their relationship(s).

In various embodiments, vehicle on-board computing device 220 may determine a motion plan for the autonomous vehicle. For example, vehicle on-board computing device 220 may determine a motion plan for the autonomous vehicle based on the perception data and/or the prediction data. Specifically, given predictions about the future locations of proximate objects and other perception data, vehicle on-board computing device 220 can determine a motion plan for AV 102 that best navigates the autonomous vehicle relative to the objects at their future locations.

In some non-limiting embodiments, vehicle on-board computing device 220 may receive predictions and make a decision regarding how to handle objects and/or actors in the environment of AV 102. For example, for a particular actor (e.g., a vehicle with a given speed, direction, turning angle, etc.), vehicle on-board computing device 220 decides whether to overtake, yield, stop, and/or pass based on, for example, traffic conditions, map data, state of the autonomous vehicle, etc. Furthermore, vehicle on-board computing device 220 also plans a path for AV 102 to travel on a given route, as well as driving parameters (e.g., distance, speed, and/or turning angle). That is, for a given object, vehicle on-board computing device 220 decides what to do with the object and determines how to do it. For example, for a given object, vehicle on-board computing device 220 may decide to pass the object and may determine whether to pass on the left side or the right side of the object (including motion parameters such as speed). Vehicle on-board computing device 220 may also assess the risk of a collision between a detected object and AV 102. If the risk exceeds an acceptable threshold, it may determine whether the collision can be avoided if the autonomous vehicle follows a defined vehicle trajectory and/or one or more dynamically generated emergency maneuvers is performed in a pre-defined time period (e.g., N milliseconds). If the collision can be avoided, then vehicle on-board computing device 220 may execute one or more control instructions to perform a cautious maneuver (e.g., mildly slow down, accelerate, or change lane). Vehicle on-board computing device 220 may execute one or more control instructions for execution of an emergency maneuver (e.g., brake and/or change direction of travel).

As discussed above, planning and control data related to maneuvering the autonomous vehicle in the roadway is generated for execution. Vehicle on-board computing device 220 may, for example, control braking via a brake controller; direction via a steering controller; speed and acceleration via a throttle controller (in a gas-powered vehicle) or a motor speed controller (such as a current level controller in an electric vehicle); a differential gear controller (in vehicles with transmissions); and/or other controllers.

In the various embodiments discussed in this document, the description may state that the vehicle or a controller included in the vehicle may implement programming instructions that cause the controller to make decisions and use the decisions to control operations of one or more vehicle systems via the vehicle control system of the vehicle. However, the embodiments are not limited to this arrangement, as in various embodiments the analysis, decision making, and/or operational control may be handled in full or in part by other computing devices that are in electronic communication with the vehicle's on-board controller and/or vehicle control system. Examples of such other computing devices include an electronic device (such as, a smartphone) associated with a person who is riding in the vehicle, as well as, a remote server that is in electronic communication with the vehicle via a wireless network. The processor of any such device may perform the operations that will be discussed below.

Figure 3:
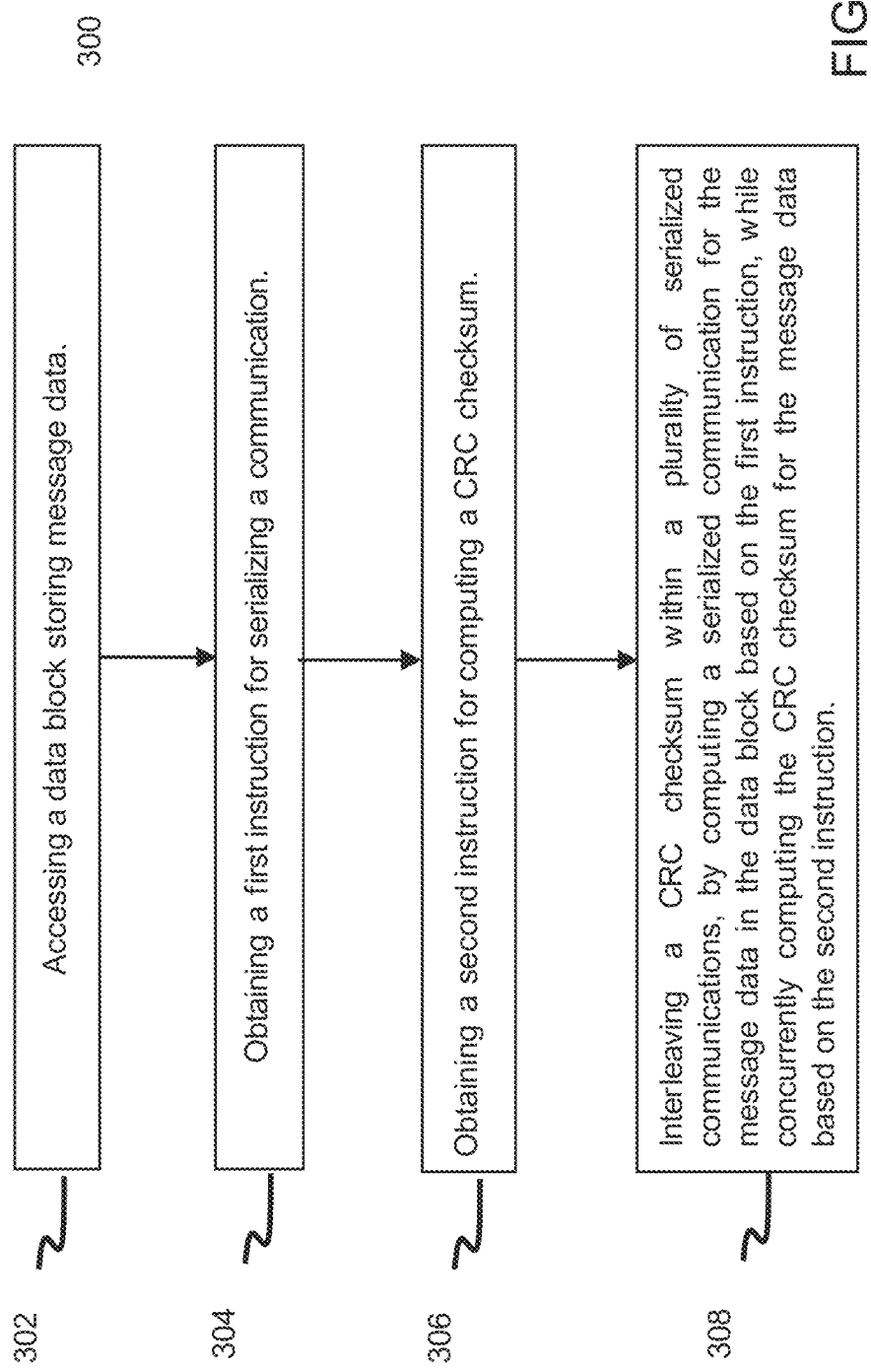
FIG. 3 is a flowchart of a non-limiting embodiment or aspect of a method for end-to-end CRC overhead hiding.
Figure 4:
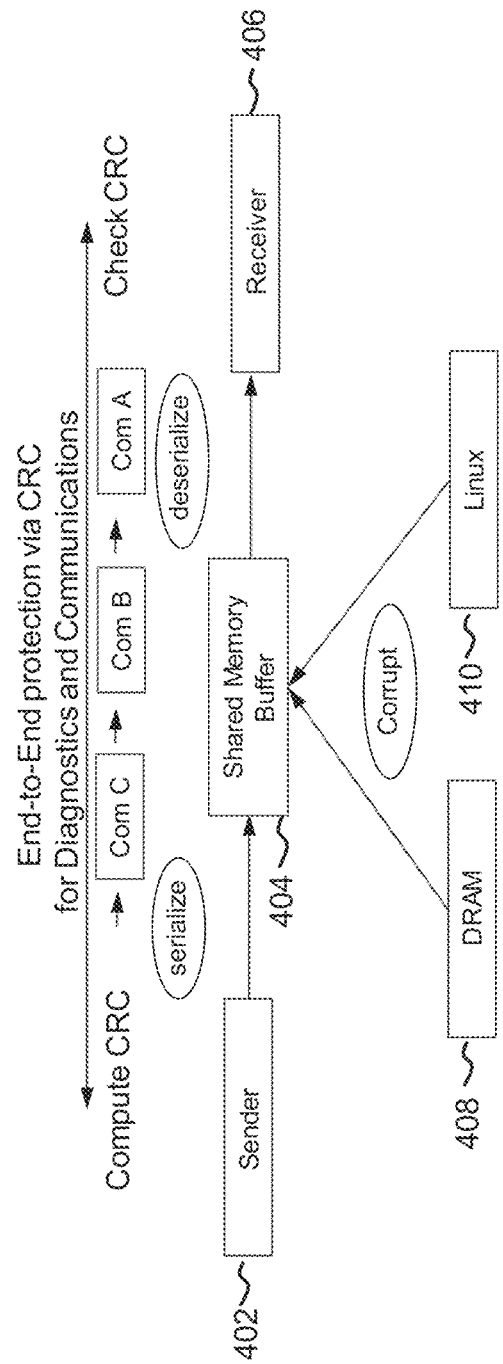
FIG. 4 illustrates non-limiting embodiments or aspects of a roadway environment in which systems, apparatuses, and/or methods, of end-to-end CRC overhead hiding as described herein, may be implemented.
Figure 5:
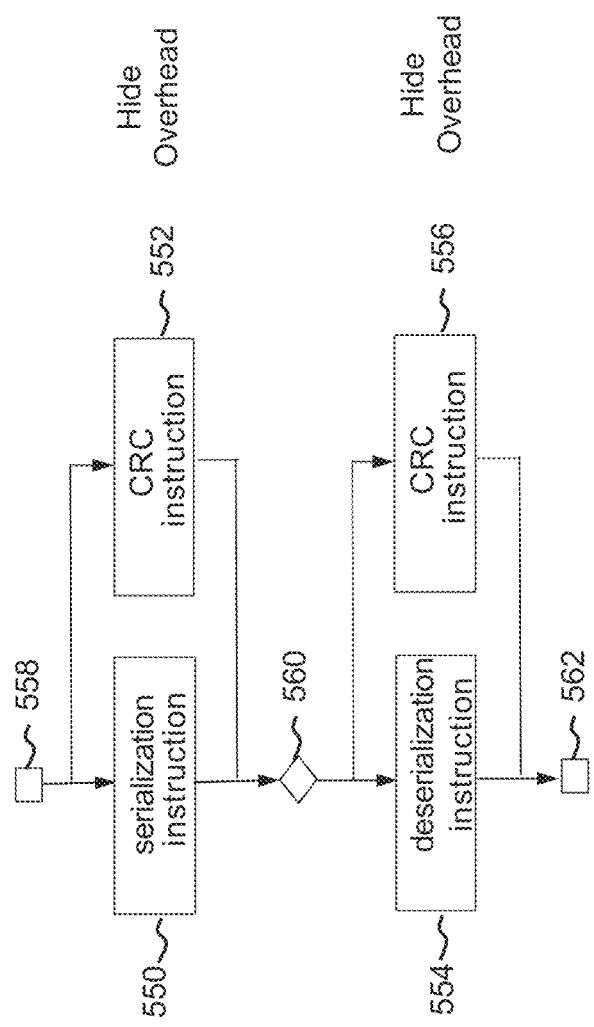
FIG. 5 illustrates non-limiting embodiments or aspects of a roadway environment in which systems, apparatuses, and/or methods, of end-to-end CRC overhead hiding as described herein, may be implemented.

FIG. 3 illustrates a flowchart of a non-limiting embodiment or aspect of process 300 for CRC overhead hiding in autonomous vehicle systems (e.g., self-driving systems of FIG. 1 and an autonomy vehicle control stack, sensors, control systems of FIG. 2, and/or the like) and other AV applications. In some non-limiting embodiments or aspects, one or more of the steps of process 300 for CRC overhead hiding is performed (e.g., completely, partially, and/or the like) by AV 102 (e.g., on-board computing device 112, one or more devices of AV 102, information generated from and/or received from AV 102, etc.). In some non-limiting embodiments or aspects, one or more of the steps of process 300 may be performed (e.g., completely, partially, and/or the like) by, include communications from, or generate information for one or more components or elements of AV system architecture 200 of FIG. 2, one or more components of a communication channel 400 as shown in FIG. 4, one or more components of CRC overhead hiding system 500 as shown in FIG. 5, one or more processors of a self-driving system of AV 102, or based on information received from autonomy systems (e.g., data related to an on-board autonomous vehicle system, data related to an on-board autonomous vehicle service provider, data related to a device of on-board autonomous vehicle system, data about an on-board vehicle service, data related to an on-board vehicle controller or software program, data related to a sensor of an on-board vehicle system, or diagnostic information about any of the above identified systems, and/or the like.

As shown in FIG. 3, at step 302, process 300 may include accessing a data block. In some non-limiting embodiments or aspects, for example, AV 102 (e.g., one or more processors of AV 102, one or more components of AV 102, one or more applications of AV 102, one or more sensors of AV 102, one or more processors of on-board computing device 112, etc.) accesses a data block to generate CRC overhead hiding. In some non-limiting embodiments or aspects, one or more components of AV 102 or one or more applications of AV 102 transfer data to a data block of a processor to generate an inter-process or intra-process communication. For example, a data block may be stored and accessed from memory, such as random access memory.

In some non-limiting embodiments or aspects, as an example, a vehicle pose is accessed by AV 102 to determine position and orientation of the vehicle in space. If that data is corrupted, parts of the system would have erroneous factual bases regarding surrounding environment, and thereby, erroneous factual bases about the state of the vehicle in the environment. In such an example, one or more processors of AV 102 may receive the vehicle pose data (or data of any other component) as a communication. In this example, one or more processors of AV 102 access the pose data in order to serialize the pose data and to compute a CRC instruction for the pose data.

In some non-limiting embodiments or aspects, one or more processors of AV 102 can hardware accelerate the CRC calculations. For example, the one or more processors of AV 102 are able to insert up to 64 bits of data into a CRC execution state using one instruction. Such speeds are much faster than a CRC calculation written in a programming language like c, even when running on an embedded micro controller. For example, hardware accelerated CRC is orders of magnitude faster because it is provided on dedicated silicone. In addition, one or more processors of AV 102 include out of order execution engines (e.g., super-scalar connectors, etc.) that may provide parallel execution. In some non-limiting embodiments or aspects, one or more processors of AV 102 may compute CRC instructions that may include instructions interleaved with either deserialization or serialization of data, thereby performing parallel execution.

The CRC computation process can be computational and time intensive, as it involves copying of regions of memory from one place to another (e.g., one region of a processor to another). Therefore, by limiting such copying of memory on each intermediate step (e.g., by copying once into a register of the one or more processors of AV 102, etc.) within the processor, overhead hiding can be achieved. For example, as one or more processors of AV 102 moves that data (e.g., marshaling or serializing the data into a different form), the data for CRC can be accessed without an additional copy being made. In such an example, a CRC instruction is used to simultaneously take the data and insert it into the CRC accumulation table where a CRC is computed, thereby eliminating movement (which can cause corruption, faults, etc.) and overhead. While trafficking or marshaling that data from one place to another, the CRC computation is calculated for the same data. In such an example, fetching from RAM to CPU is reduced or eliminated, thereby eliminating memory access which is the critical bottleneck for CRC overhead.

Returning to FIG. 3, at step 304, process 300 may include obtaining a first instruction. In some non-limiting embodiments or aspects, for example, AV 102 (e.g., one or more processors of AV 102, one or more components of AV 102, one or more applications of AV 102, one or more sensors of AV 102, one or more processors of on-board computing device 112, etc.) obtains a first instruction for serializing a data stream.

In some non-limiting embodiments or aspects, one or more components of AV 102 or the one or more applications of AV 102 sends a first instruction to the microprocessor for serializing data associated with the one or more components of AV 102 or the one or more applications of AV 102, such that the first instruction may be obtained by one or more processors of AV 102. In some examples, the first instruction may comprise one or more instructions for serializing a data stream or one or more other instructions associated with communicating the data stream.

Serialization is the process of translating the message data as seen by the application software into a byte stream that can be used for transportation on a communication channel. Serialization utilizes the execution units of the CPU cores but normally does not use the CRC instruction, which is therefore idle during serialization. In some non-limiting embodiments or aspects, the present disclosure integrates the CRC instructions into the serialization code, such that the CRC instructions can be executed concurrently with other instructions. In some non-limiting embodiments or aspects, the CRC calculation does not add any latency to the communication process.

Again with reference to FIG. 3, at step 306, process 300 may include obtaining a second instruction for CRC computation. In some non-limiting embodiments or aspects, for example, AV 102 (e.g., one or more processors of AV 102, one or more components of AV 102, one or more applications of AV 102, one or more sensors of AV 102, one or more processors of on-board computing device 112, etc.) obtains a second instruction for computing a CRC checksum (e.g., CRC residue) over the data block.

Figure 6:
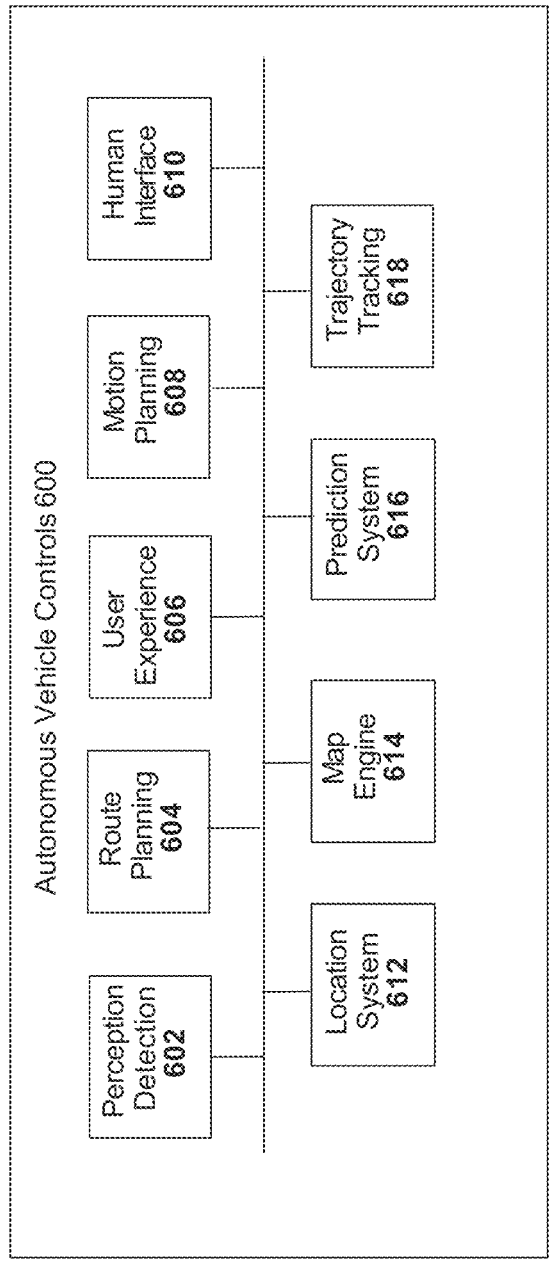
FIG. 6 provides a diagram of non-limiting embodiments or aspects of autonomous vehicle controls in which end-to-end CRC overhead hiding, as described herein, may be implemented to protect communications.

Returning to the vehicle pose example, each time pose data is published (e.g., communicated rapidly) to different parts of the system, the pose data (e.g. a plurality of matrices) is serialized and simultaneously (and in parallel) a CRC check is performed. In such an example, on the receiving end (e.g., the other side of the communication channel, as shown in FIG. 6 and FIG. 7 below, for example) when the pose communication is deserialized out of shared memory buffer, the one or more processors of AV 102 accesses the array of bytes from the shared memory buffer and reconstitutes (e.g., deserializes) the pose on the other side. While reconstituting the pose, the CRC checksum (e.g., CRC residue) is computed (e.g., at that same point in as the deserializing step, etc.). When the process is completed for deserializing, the message is expected to not be corrupted, and to ensure this, the CRC can be double checked against the original CRC that was reported earlier. If there is a mismatch, the data is considered no good (e.g., corrupted). This process can provide further efficiency since the serialization and CRC checksum need only be calculated once and then can be sent to many different components throughout the AV.

In some non-limiting embodiments or aspects, the second instruction comprises one or more instructions for computing a CRC checksum. In some non-limiting embodiments or aspects, the one or more processors of AV 102 include dedicated instructions for computing particular forms of CRC (e.g., dedicated CRC instructions as available on Intel processors, ARM processors, etc.). However, while a dedicated CRC instruction is described, the techniques may further be applied where no explicit dedicated CRC instruction is provided by a processor or where a custom CRC instruction is provided.

As shown in FIG. 3, at step 308, process 300 may include interleaving a CRC message within a plurality of serialized messages by concurrently computing the CRC for the data block based on the first instruction while computing a corresponding serialized message for the data block. In some non-limiting embodiments or aspects, for example, AV 102 (e.g., one or more processors of AV 102, one or more components of AV 102, one or more applications of AV 102, one or more sensors of AV 102, one or more processors of on-board computing device 112, etc.) interleaves a CRC message within a plurality of serialized messages of a communication channel by concurrently computing the CRC for the data block based on the first instruction while computing a corresponding serialized message for the data block.

In some non-limiting embodiments or aspects, the communication channel comprises a shared memory buffer of at least one of the one or more processors of AV 102, the one or more components of AV 102, the one or more applications of AV 102, the one or more sensors (e.g., diagnostics) of AV 102, or the one or more processors of on-board computing device 112. In such an example, AV 102 sends the CRC checksum with the serialized message data to a plurality of components, as shown in FIG. 4 below.

In some non-limiting embodiments or aspects, the communication is an intra-processor communication or an inter-processor communication.

In some non-limiting embodiments or aspects, the overhead for executing a CRC instruction is hidden by AV 102 performing the CRC instruction in parallel with execution of other instructions configured to execute in parallel.

In some non-limiting embodiments or aspects, AV 102 divides a message into a plurality of data blocks. For example, returning to the vehicle pose example, each time pose data is published (e.g., communicated rapidly) to different parts of the system, the pose data (e.g. a plurality of matrices) is serialized and simultaneously (and in parallel) a CRC check is performed. In such an example, when the pose communication includes an array of bytes that exceeds the data block, such as a stream of matrices, AV 102 divides a message into a plurality of data blocks, each of the plurality of data blocks stores an amount of message data to satisfy a threshold requirement for hiding a CRC computation. For example, a threshold may be processor dependent, while in some examples the threshold is a data word (e.g., a processor dependent data word). In such an example, AV 102 accumulates a CRC message while computing a serialized communication of the message data. For example, AV 102 generates a chain of executions of the first instruction and the second instruction for each of the plurality of data blocks. For example, AV 102 executes a series of instructions for a current CRC and a next data block of the plurality of data blocks to process. AV 102 generates a stream of serialized data with a checksum over a number of packets in the stream.

In some non-limiting embodiments or aspects, a receiver as shown below in FIG. 4, receives the communication interleaving the CRC checksum within the serialized communication. AV 102 obtains or sends a third instruction for deserializing the communication. AV 102 obtains or sends a fourth instruction for computing the CRC checksum. In such an example, a receiver as shown below in FIG. 4, deserializes the communication based on the third instruction, while concurrently computing a new CRC checksum for the message data based on the fourth instruction.

In some non-limiting embodiments or aspects, AV 102 compares the new CRC checksum to the CRC checksum to determine whether data corruption has likely occurred. In the example, in response to determining a data corruption has likely occurred, one or more processors of AV 102 protect against a fault in the shared memory buffer by performing at least one of: notifying a sender, resending the communication, or recalculating the new CRC checksum.

FIG. 4 illustrates an exemplary AV communication channel 400 where CRC overhead hiding provides end-to-end protection of a communication. AV communication channel 400 includes at least one sender 402 (e.g., a component, an application, or a process which refers to or uses application data, objects, etc.) and at least one receiver 406 (e.g., a component using application data, objects, etc.). In such an example, the at least one sender 402 prepares and sends a communication to receiver 406. Before sending the communication, sender 402 serializes (e.g., marshals, transforms, etc.) the message data of an application to prepare the message data for sending via a communication (e.g., marshaling message data of a message to a byte stream). Sender 402 then computes a CRC residue (e.g., CRC checksum, CRC message data, etc.) for the message data.

In some non-limiting embodiments or aspects, sender 402 stores the completed communication and CRC residue in a shared memory buffer 404 for receiver 406 to obtain via an intra-processor communication, including the serialized message data and the CRC checksum.

In some non-limiting embodiments or aspects, sharing data directly via the shared memory buffer 404 can provide significant performance benefits compared to sharing data via disk or socket or other communications requiring the copying of data.

As an example, shared memory buffer 404 permits distinct processes (e.g., a process of sender 402, a process of receiver 406, etc.) to potentially read and write to a common (or shared) region of volatile memory. Shared memory buffer 404 permits the sharing of data between processes, such that the need to send messages between processes containing that data is voided. In this way, end-to-end protection is provided for a communication (e.g., Com A, Com B, and Com C of FIG. 4, etc.) of the message data as the communications are transferred via the shared memory between a process of sender 402 and a process of receiver 406. For example, the CRC residue calculated for Com A can be used to determine if a fault occurs in the shared memory buffer 404.

In some non-limiting embodiments or aspects, a CRC residue can be compared to the received message to determine if a fault has occurred in the dynamic random access memory (DRAM) 408. Errors in DRAM 408 are commonly a form of hardware failure in modern compute clusters. In some examples, an error in DRAM 408 is an event that leads to the logical state of one or multiple bits being read differently from how they were last written. Memory errors can be classified into soft errors, which randomly corrupt bits but do not leave physical damage, and hard errors, which corrupt bits in a repeatable manner because of a physical defect. The consequence of a memory error is system dependent. In systems using memory without support for error correction and detection, a memory error can lead to a machine crash or applications using corrupted data. Memory errors can be caused by electrical or magnetic interference (e.g. due to cosmic rays), can be due to problems with the hardware (e.g. a bit being permanently damaged), or can be the result of corruption along the data path between the memories and the processing elements.

In some non-limiting embodiments or aspects, a CRC residue can be compared to the received message to determine if a fault has occurred in operating system 410, such as Linux. For example, errors in operating system 410 are commonly hardware errors in the memory or cache, the direct memory access (DMA), the fabric switches, the thermal throttling, the transport bus, and/or the like. Other communication protocols can also be used when data must be moved between different parts of a computer application or from one application to another, such as using CRC to transmit messages between processes containing that data (e.g., sharing data via disk, socket, or other communication, etc.).

FIG. 5 illustrates an exemplary CRC overhead hiding system 500 that includes CRC overhead hiding in an end-to-end protection of a communication channel. In some non-limiting embodiments or aspects, AV 102 continually hides performance overhead by interleaving a CRC instruction into other instructions needed to communicate a message (e.g., serialization instructions, marshaling instructions, deserializing instructions, unmarshaling instructions, etc.).

In some non-limiting embodiments or aspects, data block 558 is accessed by sender 402 (i.e., the component described above in association with FIG. 4). Sender 402 then obtains (e.g., a process or an element of sender 402 receives, reads, stores, transfers, etc.) serialization instruction 550 and CRC instruction 552. Sender 402 then interleaves a CRC message within a plurality of serialized messages, by concurrently computing the CRC for the data block based on the second instruction (e.g., serialization instruction 550) while computing a corresponding serialized message for the data block based on serialization instruction 550. Processing of serialization instruction 550 and CRC instruction 552 results in serialized communication 560 which includes a corresponding CRC residue (e.g., checksum). In some examples, the serialized communication and corresponding CRC residue are stored in and/or sent via communication 560 which includes storing the results in a shared memory buffer for communicating the contents to receiver 406.

In some non-limiting embodiments or aspects, sender 402 integrates the CRC instructions into the serialization code, such that the CRC instruction can be executed in parallel to other instructions. In this way, the CRC computation does not add, and eliminates, any overhead or latency associated with protecting communication 560.

In some non-limiting embodiments or aspects, receiver 406 accesses communication 560 in the shared memory buffer shown in FIG. 4. Additionally, receiver 406 obtains deserialization instruction 554 and CRC instruction 556. In this example, the deserializing instruction 554 for the communication is performed using instructions to deserialize the message data while concurrently computing (e.g., in parallel) a new CRC checksum for the message data based on a CRC instruction (e.g., CRC instructions, one or more CRC instructions, etc.).

In some non-limiting embodiments or aspects, the new CRC checksum may be used by receiver 406 for comparing the new CRC checksum to the CRC checksum computed in association with CRC instruction 552 to determine whether data corruption has likely occurred. In this case, after comparing CRC checksums, if it is determined that the checksums do not match, a data corruption has likely occurred. If data corruption has occurred (or is believed to have occurred), protection against a fault in the shared memory buffer is provided. For example, receiver 406 may notify a sender, resend the communication, recalculate the new CRC checksum, and/or the like.

In this way, CRC overhead is hidden by processing a CRC instruction simultaneous and in parallel (e.g., in a parallel execution unit of a superscalar processor) thereby eliminating (or hiding) an overhead for the CRC process while still providing end-to-end protection of the communication.

FIG. 6 illustrates an exemplary vehicle control system 600, in which devices, systems, and/or methods, described herein, may be implemented. Vehicle control system 600 may interconnect (e.g., establish a connection to communicate and/or the like) with on-board computing device 112, sensor system 110, user interface 116, or via communication interface 114 to remote data and processing systems (e.g., sources, computing devices, external computing systems, etc.) of database 122 (e.g., data store(s), etc.) and remote computing device 120 (e.g., central server(s), etc.), for example, vehicle control system 600 may utilize wired connections and/or wireless connections to provide an input or output exchange with local vehicle systems (e.g., one or more systems of AV 102, etc.).

With continued reference to FIG. 6, vehicle control system 600 may, additionally or alternatively, communicate with components (e.g., shown in FIG. 2, etc.), such as, an engine, wheels, steering wheel, transmission, etc., which may be controlled, using a variety of communication signals and/or commands, such as, for example, acceleration signals or commands, deceleration signals or commands, steering signals or commands, braking signals or commands, and/or the like.

In some non-limiting embodiments or aspects, vehicle control system 600 includes components for autonomous operation of AV 102 to store or retrieve (e.g., request, receive, etc.) vehicle information from one or more data stores and/or one or more central servers. For example, vehicle control system 600 may synchronize (e.g., update, change, etc.) data, interfaces, map data, and/or the like as AV 102 is traversing a roadway. Multiple AVs may be coupled to each other and/or coupled to data stores, to central servers, or to one another.

With continued reference to FIG. 6, autonomous vehicle controls 600 may receive data and provide instructions from one or more components comprising perception detection 602, location system 612, route planning 604, map engine 614, user experience 606, prediction system 616, motion planning 608, trajectory tracking 618, and human interface 610.

Location system 612 may obtain and/or retrieve map data (e.g., map information, one or more submaps, one or more maps for a geographic area, etc.) from map engine 614 which provides detailed information about a surrounding environment of the autonomous vehicle. Location system 612 may obtain detailed information about the surrounding environment of the autonomous vehicle. The map data can provide information regarding: the identity or location of different roadways, road segments, buildings, trees, signs, or other objects; the location and directions of traffic lanes (e.g., the location and direction of a parking lane, a turning lane, a bicycle lane, or other lanes within a particular roadway); traffic control data (e.g., the location and instructions of signage, traffic lights, or other traffic control devices); and/or any other map data (as described above) that provides information and assists AV 102 in analyzing a surrounding environment of the autonomous vehicle. In some non-limiting embodiments or aspects, map data may also include reference path information corresponding to common patterns of vehicle travel along one or more lanes such that a motion of an object is constrained to the reference path (e.g., locations within traffic lanes on which an object commonly travels). Such reference paths may be pre-defined, such as, the centerline of the traffic lanes. Optionally, the reference path may be generated based on historical observations of vehicles or other objects over a period of time (e.g., reference paths for straight line travel, lane merge, a turn, or the like).

In some non-limiting embodiments or aspects, location system 612 may also include and/or may receive information relating to a trip or route of a user, real-time traffic information on the route, and/or the like.

Location system 612 may also comprise and/or may communicate with route planning 604 for generating an AV navigation route from a start position to a destination position for AV cloud system. Route planning 604 may access map engine 614 (e.g., a central map data store stored in data pipeline) to identify possible routes and road segments where a vehicle may travel, to travel from a start position to a destination position. Route planning 604 may score the possible routes and identify a preferred route to reach the destination. For example, route planning 604 may generate a navigation route that minimizes a distance traveled or other cost function while traversing the route and may further access the traffic information and/or estimates that can affect an amount of time it will take to travel on a particular route. Depending on implementation, route planning 604 may generate one or more routes using various routing methods, such as, Dijkstra's algorithm, Bellman-Ford's algorithm, and/or the like. Route planning 604 may also use the traffic information to generate a navigation route which reflects an expected experience or condition of the route (e.g., current day of the week or current time of day, etc.), such that a route generated for travel during rush-hour may differ from a route generated for travel late at night. Route planning 604 may also generate more than one navigation route to a destination and send more than one of these navigation routes to user experience 606 for interfacing with a user (e.g., on a tablet, a mobile device, a vehicle device, etc.) for selection by a user from among various possible routes.

Perception detection 602 may detect information of the surrounding environment of AV 102 during travel from the start position to the destination along the preferred route, perception detection 602 may detect objects or other roadway characteristics based on sensor data provided by sensors (e.g., one or more detections, etc.) as shown and described with respect to FIG. 2, and information obtained by location system 612. The perception information represents what an ordinary driver perceives in the surrounding environment of a vehicle. The perception data may include information relating to one or more objects in the environment of the autonomous vehicle. For example, prediction system 616 may process sensor data (e.g., from LiDAR, RADAR, camera images, etc.) in order to identify objects and/or features in and around the geospatial area of the autonomous vehicle. Detected objects may include traffic signals, roadway boundaries, vehicles, pedestrians, obstacles in the roadway, and/or the like. Perception detection 602 may use known object recognition and detection algorithms, video tracking algorithms, or computer vision algorithms (e.g., tracking objects frame-to-frame iteratively over a number of time periods, etc.) to perceive an environment of AV 102.

In some non-limiting embodiments or aspects, perception detection 602 may also determine, for one or more identified objects in the environment, a current state of the object. The state information may include, without limitation, for each object: current location; current speed and/or acceleration; current heading; current orientation; size/footprint; type (e.g., vehicle vs. pedestrian vs. bicycle vs. static object or obstacle); and/or other state information.

Prediction system 616 may predict the future locations, trajectories, and/or actions of such objects perceived in the environment, based at least in part on perception information (e.g., the state data for each object) received from perception detection 602, the location information received from location system 612, sensor data, and/or any other data related to a past and/or current state of an object, the autonomous vehicle, the surrounding environment, and/or relationship(s). For example, if an object is a vehicle and the current driving environment includes an intersection, prediction system 616 may predict whether the object will likely move straight forward or make a movement into a turn, in a direction of a crossing lane, and/or the like. If the perception data indicates that the intersection has no traffic light, prediction system 616 may also predict whether the vehicle may fully stop prior to entering the intersection. Such predictions may be made for a given time horizon (e.g., 5 seconds in the future). In certain embodiments, prediction system 616 may provide the predicted trajectory or trajectories for each object to motion planning 608.

Motion planning 608 determines a motion plan for AV 102 based on the perception data, prediction data, sensor data, location data, map data, and/or the like. Specifically, given predictions about the future locations of proximate objects and other perception data, motion planning 608 can determine a motion plan (e.g., a trajectory, candidate trajectories, etc.) for autonomously navigating a route relative to one or more objects in their present and future locations.

In some examples, motion planning 608 may receive one or more predictions from prediction system 616 and make a decision regarding how to handle one or more objects in the environment surrounding AV 102. For a particular object (e.g., a vehicle with a given speed, direction, turning angle, etc.), motion planning 608 determines whether to overtake, yield, stop, and/or pass, based on, for example, traffic conditions, location, state of the autonomous vehicle, and/or the like. In some non-limiting embodiments or aspects, for a given object, motion planning 608 may decide a course to handle the object and may determine one or more actions for responding to the presence of the object. For example, for a given object, motion planning 608 may decide to pass the object and then may determine whether to pass on the left side or the right side of the object (including motion parameters, such as, speed and lane change decisions). Motion planning 608, in connection with trajectory tracking 618, may also assess a relationship between a detected object and AV 102 before determining a trajectory. Depending on the relationship (e.g., an assessment within an acceptable threshold, etc.), AV 102 may determine to avoid an object by navigating a defined vehicle trajectory and/or implementing one or more dynamically generated maneuvers performed in a pre-defined time period (e.g., N milliseconds) to compensate for the objects predicted motion. In some examples, autonomous vehicle controls 600 are used to generate appropriate control instructions for executing a maneuver (e.g., mildly slow down, accelerate, change lane, turn, etc.). In contrast, depending on a location of an object (e.g. a pose of the object in the roadway, etc.), AV 102 may be controlled to stop or change direction of travel.

Trajectory tracking 618 observes a trajectory (e.g., trajectory generation) for an autonomous vehicle while AV 102 is traversing a pre-defined route (e.g., a nominal route generated by route planning 604, etc.). The trajectory specifies a path for the autonomous vehicle, as well as, a velocity profile. AV 102 converts the trajectory into control instructions for AV 102, including but not limited to throttle/brake and steering wheel angle commands for the controls shown in FIG. 2. Trajectory generation includes decisions relating to lane changes, such as, without limitation, whether a lane change is required, where to perform a lane change, and when to perform a lane change. Specifically, one objective of motion planning 608 is to generate a trajectory for motion of the vehicle from a start position to a destination on the nominal route, taking into account the perception and prediction data.

Motion planning 608 may generate a trajectory by performing topological planning to generate a set of constraints for each of a plurality of topologically distinct classes of trajectories, optimizing a single candidate trajectory for each class, and/or scoring the candidate trajectories to select an optimal trajectory. Topological classes are distinguished by the discrete actions taken with respect to obstacles or restricted map areas. Specifically, all possible trajectories in a topologically distinct class perform the same action with respect to obstacles or restricted map areas. Obstacles may include, for example, static objects, such as, traffic cones and bollards, or other road users, such as, pedestrians, cyclists, and cars (e.g., moving cars, parked cars, double parked cars, etc.). Restricted map areas may include, for example, crosswalks and intersections. Discrete actions may include, for example, to stop before or proceed, to track ahead or behind, to pass on the left or right of an object, and/or the like.

Motion planning 608 determines or generates planning and control data regarding the n of the autonomous vehicle that is transmitted to vehicle control system, such as on-board computing device 112, or routing controller 261 for execution. AV 102, for example, utilizes a motion plan to control braking via a brake controller; direction via a steering controller; speed and acceleration via a throttle controller (in a gas-powered vehicle); or a motor speed controller (such as, a current level controller in an electric vehicle); a differential gear controller (in vehicles with transmissions); and/or other controls.

In the various embodiments discussed in this document, the description may state that the vehicle or a controller included in the vehicle may implement programming instructions that cause the controller to make decisions and use the decisions to control operations of one or more vehicle systems via the vehicle control system of the vehicle. However, the embodiments are not limited to this arrangement, as in various embodiments the analysis, decision making, and/or operational control may be handled in full or in part by other computing devices that are in electronic communication with the vehicle's on-board controller and/or vehicle control system. Examples of such other computing devices include an electronic device (such as, a smartphone) associated with a person who is riding in the vehicle, as well as, a remote server that is in electronic communication with the vehicle via a wireless network. The processor of any such device may perform the operations that will be discussed below.

FIG. 7 illustrates a diagram of an exemplary computer system 700 in which various devices, systems, and/or methods, described herein, may be implemented. Computer system 700 can be any computer capable of performing the functions described herein.

Computer system 700 includes one or more processors (also called central processing units, or CPUs), such as processor 704. Processor 704 is connected to a communication infrastructure 706 (or bus).

One or more processors 704 may each be a graphics processing unit (GPU). In an embodiment, a GPU is a processor that is a specialized electronic circuit designed to process mathematically intensive applications. The GPU may have a parallel structure that is efficient for parallel processing of large blocks of data, such as mathematically intensive data common to computer graphics applications, images, videos, and/or the like.

Computer system 700 also includes user input/output device(s) 703, such as monitors, keyboards, pointing devices, etc., that communicate with communication infrastructure 706 through user input/output interface(s) 702.

Computer system 700 also includes a main memory (or primary memory) 708, such as random access memory (RAM). Main memory 708 may include one or more levels of cache. Main memory 708 has stored therein control logic (i.e., computer software) and/or data.

Computer system 700 may also include one or more secondary storage devices or secondary memory 710. Secondary memory 710 may include, for example, hard disk drive 712 and/or removable storage device or drive 714. Removable storage drive 714 may be a floppy disk drive, a magnetic tape drive, a compact disk drive, an optical storage device, a tape backup device, and/or any other storage device/drive.

Removable storage drive 714 may interact with a removable storage unit 718. Removable storage unit 718 includes a computer usable or a readable storage device having stored thereon computer software (control logic) and/or data. Removable storage unit 718 may be a floppy disk, a magnetic tape, a compact disk, a DVD, an optical storage disk, and/or any other computer data storage device. Removable storage drive 714 reads from and/or writes to removable storage unit 718 in a well-known manner.

According to an exemplary embodiment, secondary memory 710 may include other means, instrumentalities, or other approaches for allowing computer programs and/or other instructions and/or data to be accessed by computer system 700. Such means, instrumentalities or other approaches may include, for example, removable storage unit 722 and interface 720. Examples of removable storage unit 722 and interface 720 may include a program cartridge and a cartridge interface (such as that found in video game devices), a removable memory chip (such as an EPROM or PROM) and an associated socket, a memory stick and a USB port, a memory card and an associated memory card slot, and/or any other removable storage unit and associated interface.

Computer system 700 may further include a communication or network interface 724. Communication interface 724 enables computer system 700 to communicate and interact with any combination of remote devices, remote networks, remote entities, etc. (individually and collectively referenced by remote device(s), network(s), or entity(s) 728). For example, communication interface 724 may allow computer system 700 to communicate with remote devices 728 over communication path 726, which may be wired and/or wireless, and which may include any combination of LANs, WANs, the Internet, etc. Control logic and/or data may be transmitted to and from computer system 700 via communication path 726.

In an embodiment, a tangible, non-transitory apparatus or an article of manufacture comprising a tangible, non-transitory computer useable or a readable medium having control logic (software) stored thereon is also referred to herein as a computer program product or program storage device. This includes, but is not limited to, computer system 700, main memory 708, secondary memory 710, and removable storage units 718 and 722, as well as tangible articles of manufacture embodying any combination of the foregoing. Such control logic, when executed by one or more data processing devices (such as computer system 700), causes such data processing devices to operate as described herein.

Based on the teachings contained in this disclosure, it will be apparent to persons skilled in the relevant art(s) how to make and use embodiments of this disclosure using data processing devices, computer systems, and/or computer architectures other than that shown in FIG. 7. In particular, embodiments can operate with software, hardware, and/or operating system implementations other than those described herein.

It is to be appreciated that the Detailed Description section, and not any other section, is intended to be used to interpret the claims. Other sections can set forth one or more but not all exemplary embodiments as contemplated by the inventor(s), and thus, are not intended to limit this disclosure or the appended claims in any way.

While this disclosure describes exemplary embodiments for exemplary fields and applications, it should be understood that the disclosure is not limited thereto. Other embodiments and modifications thereto are possible and are within the scope and spirit of this disclosure. For example, and without limiting the generality of this paragraph, embodiments are not limited to the software, hardware, firmware, and/or entities illustrated in the figures and/or described herein. Further, embodiments (whether or not explicitly described herein) have significant utility to fields and applications beyond the examples described herein.

Embodiments have been described herein with the aid of functional building blocks illustrating the implementation of specified functions and relationships thereof. The boundaries of these functional building blocks have been arbitrarily defined herein for the convenience of the description. Alternate boundaries can be defined as long as the specified functions and relationships (or equivalents thereof) are appropriately performed. Also, alternative embodiments can perform functional blocks, steps, operations, methods, etc. using orderings different than those described herein.

References herein to "one embodiment," "an embodiment," "an example embodiment," or similar phrases, indicate that the embodiment described can include a particular feature, structure, or characteristic, but every embodiment can not necessarily include the particular feature, structure, or characteristic. Moreover, such phrases are not necessarily referring to the same embodiment. Further, when a particular feature, structure, or characteristic is described in connection with an embodiment, it would be within the knowledge of persons skilled in the relevant art(s) to incorporate such feature, structure, or characteristic into other embodiments whether or not explicitly mentioned or described herein. Additionally, some embodiments can be described using the expression "coupled" and "connected" along with their derivatives. These terms are not necessarily intended as synonyms for each other. For example, some embodiments can be described using the terms "connected" and/or "coupled" to indicate that two or more elements are in direct physical or electrical contact with each other. The term "coupled," however, can also mean that two or more elements are not in direct contact with each other, but yet still co-operate or interact with each other.

The breadth and scope of this disclosure should not be limited by any of the above-described exemplary embodiments, but should be defined only in accordance with the following claims and their equivalents.

What is claimed is:

1. An end-to-end cyclic redundancy check (CRC) overhead hiding method, comprising:
   accessing, by a microprocessor, a data block storing message data;
   obtaining, by the microprocessor, a first instruction for serializing a communication;
   obtaining, by the microprocessor, a second instruction for computing a CRC checksum;
   interleaving, by the microprocessor, the CRC checksum with serialized message data to generate a communication within a communication channel, by computing a serialized communication of the message data in the data block based on the first instruction, while concurrently computing the CRC checksum for the message data based on the second instruction;
   dividing a message into a plurality of data blocks, each of the plurality of data blocks storing an amount of message data to satisfy a threshold requirement for hiding a CRC computation; and
   accumulating a CRC message while computing a serialized communication of the message data by chaining executions of the first instruction and the second instruction for each of the plurality of data blocks while executing an instruction for a current CRC and a next data block of the plurality of data blocks to process.

2. The end-to-end CRC overhead hiding method of claim 1, wherein overhead for executing a CRC instruction is hidden by performing the CRC instruction in parallel with execution of other instructions configured to execute in parallel.

3. The end-to-end CRC overhead hiding method of claim 1, wherein the first instruction is a separate instruction from the second instruction, and wherein the first instruction and the second instruction each comprises a plurality of instructions.

4. The end-to-end CRC overhead hiding method of claim 1, wherein the communication is an intra-processor communication.

5. An end-to-end cyclic redundancy check (CRC) overhead hiding method, comprising:
   accessing, by a microprocessor, a data block storing message data;
   obtaining, by the microprocessor, a first instruction for serializing a communication;
   obtaining, by the microprocessor, a second instruction for computing a CRC checksum; and
   interleaving, by the microprocessor, the CRC checksum with serialized message data to generate a communication within a communication channel, by computing a serialized communication of the message data in the data block based on the first instruction, while concurrently computing the CRC checksum for the message data based on the second instruction,
   wherein the communication channel comprises a shared memory buffer of at least one of an autonomous vehicle (AV), a sensor system of the AV, or an on-board computing device of the AV, and the end-to-end CRC overhead hiding method further comprises:
   sending the CRC checksum with the serialized message data to a plurality of components via the shared memory buffer.

6. The end-to-end CRC overhead hiding method of claim 5, further comprising:
   receiving the communication interleaving the CRC checksum within the serialized communication;
   obtaining a third instruction for deserializing the communication;
   obtaining a fourth instruction for computing the CRC checksum; and
   deserializing the communication based on the third instruction, while concurrently computing a new CRC checksum for the message data based on the fourth instruction.

7. The end-to-end CRC overhead hiding method of claim 6, further comprising:
   comparing the new CRC checksum to the CRC checksum to determine whether data corruption has likely occurred; and
   in response to determining a data corruption has likely occurred, protecting against a fault in the shared memory buffer, by performing at least one of: notifying a sender, resending the communication, or recalculating the new CRC checksum.

8. The end-to-end CRC overhead hiding method of claim 5, wherein overhead for executing a CRC instruction is hidden by performing the CRC instruction in parallel with execution of other instructions configured to execute in parallel.

9. The end-to-end CRC overhead hiding method of claim 5, wherein the first instruction is a separate instruction from the second instruction, and wherein the first instruction and the second instruction each comprises a plurality of instructions.

10. The end-to-end CRC overhead hiding method of claim 5, wherein the communication is an intra-processor communication.

11. A non-transitory computer-readable medium having instructions stored thereon that, when executed by at least one computing device, cause the at least one computing device to:
    access a data block storing message data;
    obtain a first instruction for serializing a communication;
    obtain a second instruction for computing a cyclic redundancy check (CRC) checksum;
    interleave the CRC checksum with serialized message data to generate a communication within a communication channel, by computing a serialized communication of the message data in the data block based on the first instruction, while concurrently computing the CRC checksum for the message data based on the second instruction;
    divide a message into a plurality of data blocks, each of the plurality of data blocks storing an amount of message data to satisfy a threshold requirement for hiding a CRC computation; and
    accumulate a CRC message while computing a serialized communication of the message data by chaining executions of the first instruction and the second instruction for each of the plurality of data blocks while executing an instruction for a current CRC and a next data block of the plurality of data blocks to process.

12. The non-transitory computer-readable medium of claim 11, wherein overhead for executing a CRC instruction is hidden by performing the CRC instruction in parallel with execution of other instructions configured to execute in parallel.

13. The non-transitory computer-readable medium of claim 11, wherein the first instruction is a separate instruction from the second instruction, and wherein the first instruction and the second instruction each comprises a plurality of instructions.

14. The non-transitory computer-readable medium of claim 11, wherein the communication is an intra-processor communication.

15. A non-transitory computer-readable medium having instructions stored thereon that, when executed by at least one computing device, cause the at least one computing device to:
   access a data block storing message data;
   obtain a first instruction for serializing a communication;
   obtain a second instruction for computing a cyclic redundancy check (CRC) checksum; and
   interleave the CRC checksum with serialized message data to generate a communication within a communication channel, by computing a serialized communication of the message data in the data block based on the first instruction, while concurrently computing the CRC checksum for the message data based on the second instruction,
   wherein the communication channel comprises a shared memory buffer of at least one of an autonomous vehicle (AV), a sensor system of the AV, or an on-board computing device of the AV, and sending the CRC checksum with the serialized message data to a plurality of components.

16. The non-transitory computer-readable medium of claim 15, wherein overhead for executing a CRC instruction is hidden by performing the CRC instruction in parallel with execution of other instructions configured to execute in parallel.

17. The non-transitory computer-readable medium of claim 15, having further instructions stored thereon that, when executed by at least one computing device, cause the at least one computing device to:
   divide a message into a plurality of data blocks, each of the plurality of data blocks storing an amount of message data to satisfy a threshold requirement for hiding a CRC computation; and
   accumulate a CRC message while computing a serialized communication of the message data by chaining executions of the first instruction and the second instruction for each of the plurality of data blocks while executing an instruction for a current CRC and a next data block of the plurality of data blocks to process.

18. The non-transitory computer-readable medium of claim 15, wherein the first instruction is a separate instruction from the second instruction, and wherein the first instruction and the second instruction each comprises a plurality of instructions.

19. The non-transitory computer-readable medium of claim 15, wherein the communication is an intra-processor communication.

* * * * *